(12) United States Patent
Chang et al.

(10) Patent No.: US 8,453,466 B2
(45) Date of Patent: Jun. 4, 2013

(54) HEAT-POWER CONVERSION MAGNETISM DEVICE AND SYSTEM FOR CONVERTING ENERGY THEREBY

(75) Inventors: Shao Hsiung Chang, Taoyuan Hsien (TW); Chii-How Chang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 382 days.

(21) Appl. No.: 12/872,810

(22) Filed: Aug. 31, 2010

(65) Prior Publication Data

US 2011/0048032 A1  Mar. 3, 2011

Related U.S. Application Data

(60) Provisional application No. 61/238,504, filed on Aug. 31, 2009.

(51) Int. Cl.
  *F25B 21/00* (2006.01)
(52) U.S. Cl.
  USPC ............................................ 62/3.1; 62/235.1
(58) Field of Classification Search
  USPC .......... 62/3.1, 3.3, 235.1, 236, 467; 219/608, 219/619; 310/49.32, 306; 399/69, 335
  See application file for complete search history.

(56) References Cited

U.S. PATENT DOCUMENTS

| | | | |
|---|---|---|---|
| 396,121 A | 1/1889 | Tesla | |
| 428,057 A | 5/1890 | Tesla | |
| 476,983 A | 6/1892 | Edison | |
| 4,447,736 A | 5/1984 | Katayama | |
| 4,829,770 A * | 5/1989 | Hashimoto | 62/3.1 |
| 6,103,968 A * | 8/2000 | Gutkin | 136/203 |
| 6,595,004 B1 * | 7/2003 | Ghoshal | 62/3.1 |
| 6,668,560 B2 | 12/2003 | Zimm et al. | |
| 6,766,817 B2 | 7/2004 | da Silva | |
| 6,826,915 B2 * | 12/2004 | Wada et al. | 62/3.1 |
| 6,935,121 B2 | 8/2005 | Fang et al. | |
| 7,069,979 B2 * | 7/2006 | Tobias | 165/104.33 |
| 7,076,958 B2 * | 7/2006 | Saito et al. | 62/3.1 |
| 7,168,255 B2 * | 1/2007 | Saito et al. | 62/3.1 |
| 7,481,064 B2 * | 1/2009 | Kitanovski et al. | 62/3.1 |
| 7,561,816 B2 * | 7/2009 | Asakura et al. | 399/69 |
| 7,610,006 B2 * | 10/2009 | Watanabe et al. | 399/328 |
| 7,917,048 B2 * | 3/2011 | Ito | 399/67 |
| 8,037,692 B2 * | 10/2011 | Muller et al. | 62/3.1 |
| 8,099,964 B2 * | 1/2012 | Saito et al. | 62/3.1 |
| 2007/0130960 A1 | 6/2007 | Muller et al. | |
| 2008/0236172 A1 | 10/2008 | Muller et al. | |

\* cited by examiner

*Primary Examiner* — Mohammad Ali
(74) *Attorney, Agent, or Firm* — Muncy, Geissler, Olds & Lowe, PLLC

(57) ABSTRACT

The invention discloses a heat-power conversion magnetism device. The heat-power conversion magnetism device includes a magneto caloric effect material so that the magnetic field thereof can be changed according to a temperature difference. The heat-power conversion magnetism device is rotated by changing the magnetic field of the magneto caloric effect material. A system for converting energy by use of the heat-power conversion magnetism device is also disclosed.

24 Claims, 23 Drawing Sheets

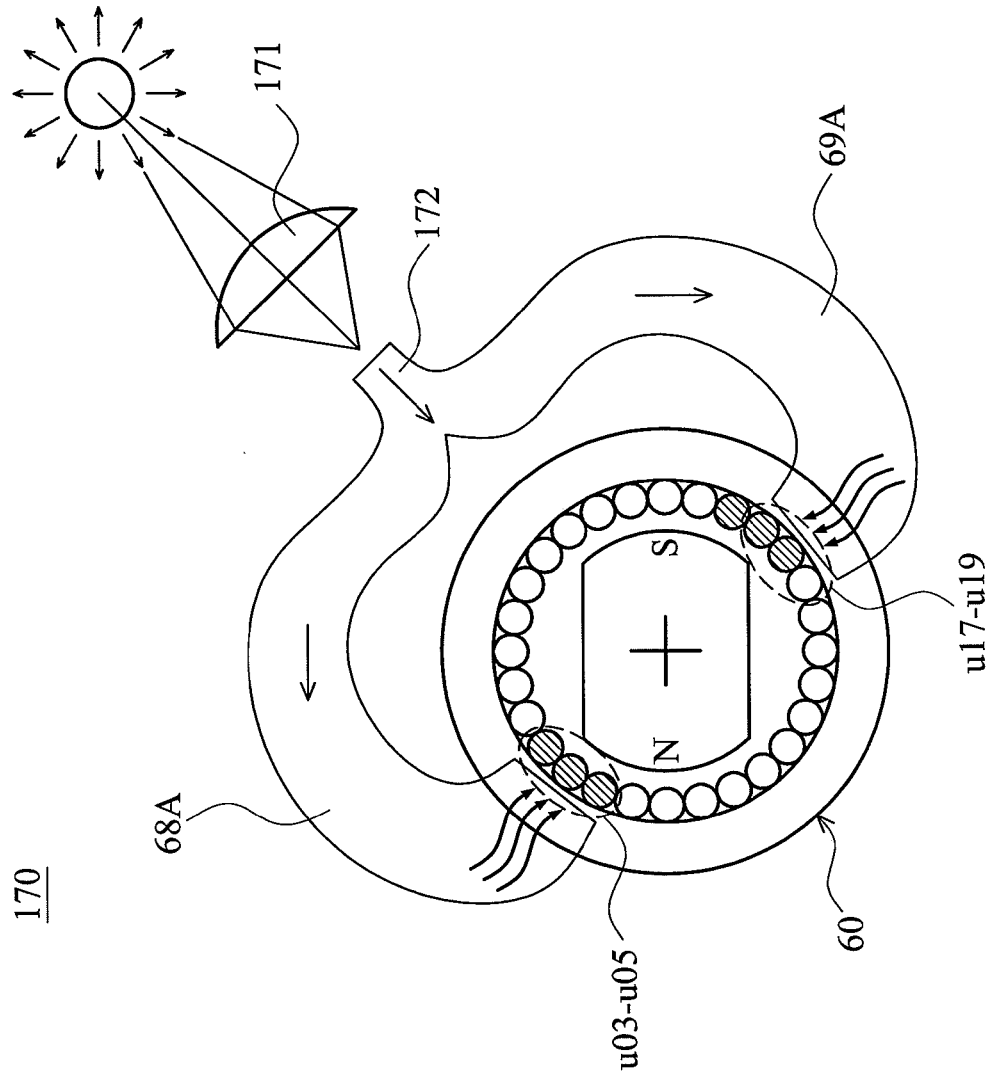

HEAT-POWER CONVERSION MAGNETISM DEVICE AND SYSTEM FOR CONVERTING ENERGY THEREBY

CROSS REFERENCE TO RELATED APPLICATIONS

The present application claims the benefit of U.S. provisional application entitled "HEAT-POWER CONVERSION MAGNETISM DEVICE AND SYSTEM FOR CONVERTING ENERGY THEREBY", Ser. No. 61/238,504, field Aug. 31, 2009.

BACKGROUND OF THE INVENTION

1. Field of the Invention

The invention pertains to the field of a conversion device. More particularly, the invention pertains to a heat-power conversion magnetism device.

2. Description of the Related Art

Converting thermal energy into power had a long period of time in human history. Especially the converting thermal energy into electrical power is the most common way to produce energy source today. However, the efficiency of energy conversion is still very low. For example, the efficiency is about 40% for steam power plant and about 30% for internal combustion engine. Almost 60-70% of energy is wasted in other words. After power conversion, the remained energy becomes too low so that the temperature thereof is usually below 200° C. and is mostly below 100° C. Such kind of "low-grade" energy cannot be utilized by most of the thermal engine available today.

Taking the solar energy as an example, the sunshine provides a huge amount of energy to earth, but the energy density is one KW per square meter only. Flat panel of sunshine collector can convert solar energy into thermal energy very efficiently (>90%) and cost effectively, but the thermal energy density is relative low. Usually the temperature of a flat panel solar hot water system is likely below 100° C.

To convert low grade of energy (<100° C.) into useful mechanical power by appropriate utilization of the magneto caloric effect (MCE) of solid ferromagnetic materials is desirable.

MCE has discovered for over 100 years. Emil Gabriel Warburg discovered the MCE in the iron in 1881. Soon, after Warburg's discovery, Edison and Tesla have tried to convert power from the MCE of soft iron by a loop of heating and cooling, as disclosed in U.S. Pat. No. 396,121, U.S. Pat. No. 428,057 and U.S. Pat. No. 476,983. For a very long period of time, such technology was only applied in very low temperature refrigeration to cool down samples at few Kelvin to tens Kelvin since 1930's. For near room temperature applications, magnetic refrigeration was not able to achieve until 1976. Gadolinium (Gd) has been used as a magneto cooling working material and demonstrated the magnetic refrigeration at near room temperature in 1976. Gd, which has a Curie point of 293 Kelvin, is used as a magneto cooling working material by G. V. Brown of National Aeronautics and Space Administration. The temperature change of 14° K. has been produced by applying 7 T magnetic field. Since then the study of the application of MCE materials has been increased, a lot of MCE material properties can be found in the disclosure of K. A. Gschneidner Jr, V. K. Pecharsky, "Recent developments in magnetocaloric materials", Institute of Physics Rublishing, Reports on Progress in Physics, Rep. Prog. Phys. 68 (2005) 1479-1539.

In 1997, V. K. Pecharsky and K. A. Gschneidner discovered that the entropy change (DS) of $Gd_5(Si_xGe_{1-x})_4$ is much larger then Gd in near room temperature, and the Curie temperature thereof can be changed from 29 Kelvin to 290 Kelvin by changing the composition of silicon(Si) and Ge. $Gd_5(Si_xGe_{1-x})_4$ can be a desirable magneto caloric effect material (MCEM).

The basic principle of magneto caloric effect can be used as the magnetic refrigeration (or heat pump), which is disclosed in Peter W. Egolf, Andrej Kitanovski, "An introduction to magnetic refrigeration", University of Applied Sciences of Western Switzerland; C. Zimm, A. Jastrab, "Description and Performance of a Near-Room Temperature Magnetic Refrigerator", Advances in Cryogenic Engineer, Vol. 43; and G. V. Brown, "Magnetic heat pumping near room temperature", Journal of Applied Physics, Vol. 47, No. 8, August 1976, also we can find the basic theory of magnetic cooling in the disclosure Andrej Kitanovski, Peter W. Egolf, "Thermodynamics of magnetic refrigeration", International Journal of Refrigeration 29 (2006) 3-21.

For an reversible adiabatic process and from Maxwell equation, the equations are disclosed as the following:

$$\Delta Sm = -\int \mu_0 (\partial M/\partial T) dH \quad (1)$$

wherein Sm is magnetic entropy; $\mu_0$ is a permeability factor of vacuum; M is magnetic moment; T is temperature; and H is magnetic field strength;

$$\Delta T_{ad} = -\int (T/C_p)(\partial M/\partial T) dH \quad (2)$$

wherein $\Delta T_{ad}$ is adiabatic temperature change, and $C_p$ is heat capacity; and $$\Delta Sm * T = C_p * \Delta T_{ad} \quad (3)$$

When a magnetic field is applied to the MCEM and the MCEM is magnetized, the magnetic entropy, Sm, is changed according to the magnetic field changing due to the magnetic order of the material is changed. Under the adiabatic condition, the magnetic entropy change, $\Delta Sm$, must be compensated by an opposite change of the entropy associated with the lattice. The result is a change in temperature of the MCEM. In other words, when a magnetic field is applied to MCEM and the MCEM thus loses its magnetic entropy, the temperature of the MCEM rises up to compensate the magnetic entropy loss. When the magnetic field is removed away from the MCEM and the MCEM thus increases its magnetic entropy, the temperature of the MCEM cools down to compensate the magnetic entropy increase.

By using MCEM with proper thermal dynamic cycles, some heat engine for cooling, or for heating, can be designed for a better performance.

There are four basic processes for MCE magnetic heat engine: (A) adiabatic magnetization: a MCEM is subjected to a magnetic field in adiabatic condition, and the temperature of the material rises up then; (B) constant magnetic field cooling: a cold thermal heat source is provided to cool the material down to a lower temperature; (C) adiabatic demagnetization: the magnetic field is removed away from the material in an adiabatic condition, and temperature of the material goes down accordingly; and (D) zero magnetic field heat absorption: a hot thermal heat source is provided to warm up the material. For a cooling application, the process (D) is used to cool down the environment. For a heating application, the process (B) is used to warm up the environment.

From this equation, we can know that the magnetic entropy change of MCEM is relative to the ($\partial M/\partial T$). The larger ($\partial M/\partial T$) of the material is, the larger entropy change will be, which will induce larger cooling capacity of magnetic thermal cycles. For the magnetic cooling (heat pump) application, the magnetic field is chosen to change the magnetic phase of MCEM, and the result is the change of magnetic entropy and eventually the change of temperature. The more largely the magnetic moment changes, the larger cooling capacity will be achieved.

When dealing with heat-power conversion, the thermal energy is chosen to change the magnetic moment of MCEM, and the result of conversion is the power generation. For most of the MCEM, as the heat is applied to the MCEM and the temperature passes through the Curie temperature, the magnetic moment of MCEM will change from a high to a low value. Assume that a magnetism device with MCEM has been designed for the magnetic flux flowing through the MCEM. When the thermal energy is applied to the MCEM and changes its magnetic moment, the magnetic flux will be changed due to the magnetic moment change.

The magneto caloric effect material (MCEM) is not only suitable for a magnetic refrigeration application, it is also suitable for the reverse processing such as a heat-power conversion application.

U.S. Pat. Nos. 396,121, 428,057 and 476,983 show the earlier ideas of heat-power conversion device. Although those prior arts give some great ideas of how to change the thermal energy into the mechanical energy or electrical power, it never comes to realization. It requires huge amount of energy to rise the temperature up to the Curie temperature, and the converting efficiency is low. Simply because of the near room temperature, MCEMs had not been discovered until 1970's. U.S. Pat. No. 396,121 also requires spring or flywheel as mechanical energy storage device to complete the thermal cycle. Also, the armature moves forward and backward like a pendulum, which is not an efficient way for power generation.

Both U.S. Pat. No. 428,057 and U.S. Pat. No. 476,983 require electric conductor coil for electrical power generation. When the temperature of the magnetic core is changed around its Curie temperature, the magnetic moment will be changed and thus cause the magnetic flux to change, thus the induced electrical current flows through the electric conductor coil. Another report in the disclosure of Paul F. Massier, C. P. Bankston, ECUT, Energy Conversion and Utilization Technologies Program "Direct Conversion Technology", Annual Summary Report CY1988, Dec. 1, 1988a also introduces electric conductor coil for electrical power generation. The problem of electric conductor coil is that the power generation of the coil strongly depends on the magnetic flux changing frequency. The thermal transfer process for changing the magnetic moment of MCEM is a slow procedure, and the cycle time is 6 seconds (0.166 Hz) in the report of Reference of C. Zimm, A. Jastrab, "Description and Performance of a Near-Room Temperature Magnetic Refrigerator", Advances in Cryogenic Engineer, Vol. 43. Another report of Dr. Zimm of Astronautics Corporation shows the operation frequency of 4 Hz. Being under such a low operation frequency will limit the electrical power output of electric conductor coil and waste large amount of MCEM for converting enough power.

U.S. Pat. No. 4,447,736 discloses the rotary magneto caloric ring system schematic. In this system, the MCEM is formed in a ring shape, and the MCEM is rotated around the center of the ring shape. An extra magnet covers certain portion of the ring, and a hot heat exchanger and a cold heat exchanger are applied to the rotating ring. A part of the rotation ring is being heated by the hot heat exchanger, and a part of the rotation ring which is outside the magnetic field bounds is being cooled. The cooled portion of rotary magneto caloric ring, which the temperature is under its Curie temperature, will be attracted by the magnetic field. Such kind of rotary magneto caloric ring system schematic can provide a continuous and smooth mechanical torque output. However, it is difficult to utilize all the magnetic flux generated by the magnet, and only a part of the magneto caloric ring is attracted by the magnet, thus the mechanical torque output is relative low. Also, how to prevent the leakage of the refrigerant between the heat exchanger and the rotary magneto caloric ring became a very difficult issue.

Some interesting magnetic cooling or heating devices for generating a thermal flux with magneto caloric materials are disclosed in US2007/0130960 and US2008/0236172. Permanent magnets are used to generate magnetic field, and multiple number of MCEMs are used so as to subject them to a variation in magnetic field. In order to generate the strongest magnetic field as possible, a number of MCEMs are arranged as a multiple number of magnets. The location arrangement of magnetic poles of magnet and the MCEMs are well alliance, and the magnetic flux can pass through the magnetic paths as smoothly as possible. In other words, the magnetic resistance of magnetic paths is designed to be minimized. For the first example of US2007/0130960, twelve thermal bodies made of MCEM and six magnetic elements are used. Such arrangement can allow the minimum magnetic resistance and maximum magnetic flux passing through the MCEMs when they are allied. Although such arrangement can create the maximum thermal effect of the MCEMs, but it also leads to extra problems. The static torque is still large and requires more driving power to move the magnetic field away from the MCEMs.

Both U.S. Pat. No. 6,668,560 and U.S. Pat. No. 6,935,121 show a rotating magnet magnetic refrigerator. Each of a number of magneto caloric materials is a common multiple of the magnetic poles, and the attraction force at neutral position is large, thus the torque required to overcome the attraction force is large.

An MCEM is temperature dependency of magnetization. Cleber Santiago Alves, Sergio Gama, "Giant Magnetocaloric effect in $Gd_5(Si_2Ge_2)$ Alloy with Low Purity Gd" and E. Bruck, O. Tegus, "Magnetic refrigeration—towards room-temperature application", Physica B 327 (2003) 431-437 show the magnetization curves of Gd, $Gd_5Si_2Ge_2$, and MnFe (P,As) at near room temperature.

FIG. 1. shows magnetization curves of Gadolinium (Gd); FIG. 2. shows magnetization curves of $Gd_5Si_2Ge_2$; FIG. 3 shows magnetization curves of $(Mn, Fe)_2P_{0.5}As_{0.5}$; and FIG. 4 shows MCE of MnFePAs in 2 T and 5 T magnetic field.

The materials in FIGS. 2 and 3 show the dramatically magnetic moment change when the temperature of the materials changes around its Curie temperature (Tc). Such kinds of materials are perfectly suitable for heat to mechanical power conversion. FIG. 4. shows the entropy change calculated using the equation (1).

When an MCEM is subjected to a magnetic field, a huge magnetic property (magnetic moment) change occurrs over relatively small temperature change near the Curie temperature. Referring to FIG. 4, it is much clear to understand how the magnetic phase changes corresponding to the temperature. At 2 T magnetic field strength, the magnetic phase changes completely when the changing temperature (around 12 Kelvin) between $T_{10}$ and $T_{high}$.

If a heat source temperature is 10 Kelvin higher then Tc, it will be enough to change the magnetic moment from high to low. Taking the FIG. 4 for an example, the Curie temperature of the material is 280 Kelvin, the hot heat source of 290 Kelvin and cold heat source of 275 Kelvin will be enough to change the magnetic moment between $T_{high}$ and $T_{low}$.

Such kind of hot heat source can be found everywhere in our ordinary life. The disclosure of Andrej Kitanovski, Marc Diebold, "Applications of Magnetic "Power Production: and its assessment", Final Report, Swiss Federal Office of Energy—BFE, 2007 shows some of the type of heat source, for example solar, geothermal, vehicle or industry processes, and the temperature range from 60° C. to 180° C. The invention intends to convert. such low-grade thermal energy into useful mechanical power efficiently.

BRIEF SUMMARY OF THE INVENTION

A new kind of heat-power conversion technology is introduced in the invention. This invention intend to achieve the goals as below:

Converting a very low temperature heat source (<100° C.) into useful power;

Without using electric conductor coils for power generation;

Simplifying rotation magnetic mechanism design; and

Performing high thermal efficiency.

Now, two important basic rules are understudied and will be used commonly in this invention as the following.

(1) The temperature of a magneto caloric effect material, MCEM, over its Curie temperature will influence the magnetic properties and the magnetic moment of the material at low level. The magnetic property is more like a paramagnetism material.

(2) The temperature of the magneto caloric effect material, MCEM, below its Curie temperature will influence the magnetic properties and the magnetic moment of the material at high level. The magnetic property is more like a ferromagnetism material.

These two basic rules will be used frequently in this invention.

An exemplary embodiment of a heat-power conversion magnetism device is provided and comprises a magnet, a sleeve, a plurality of thermal magnetic flux gate units and a hot source. The magnet has a pair of magnetic poles for providing magnetic potential energy and delivering of magnetic flux. The sleeve is disposed around the magnet. The hot source is used to heat up a first part of the thermal magnetic flux gate units. Magnetic flux paths are formed through the first part of the thermal magnetic flux gate units.

An exemplary embodiment of a thermal magnetic flux gate unit is provided, and the unit comprises a container, a porous structure and a wick structure. The container is sealed with fluid and divided into a first section and a second section. The porous structure is disposed in the first section. The wick structure is disposed at an inner face of the container. The porous structure comprises a magneto caloric effect material (MCEM).

An exemplary embodiment of a regeneration thermal convection unit is provided, and the unit comprises a container, a porous structure, a first chamber, a second chamber and fluid. The porous structure is disposed in the container. The first chamber and the second chamber are connected to the container, respectively. The fluid is filled in the container so that the fluid flows within the first chamber and the second chamber through the container. The porous structure comprises a magneto caloric effect material (MCEM).

An exemplary embodiment of a system for converting energy is provided, and the system comprises a heat collector, a hot source, a cooling tower, a cold source, a thermal energy switching unit and a hest-power conversion device. The heat collector heats refrigerant. The hot source is used to store the heated refrigerant from the heat collector. The cooling tower cools down the refrigerant. The cold source is used to stores the cooled refrigerant from the cooling tower. The thermal energy switching unit receives the heated refrigerant or the cooled refrigerant and controls an output of refrigerant. The hest-power conversion device comprises a magnet, a sleeve and a plurality of thermal magnetic flux gate units. The magnet has a pair of magnetic poles for providing magnetic potential energy and delivering of magnetic flux. The sleeve is disposed around the magnet. Some of the thermal magnetic flux gate units are heated or cooled by the output of refrigerant.

Another exemplary embodiment of a system for converting solar energy is provided, and the system comprises a collector, a distributor and a heat-power conversion magnetism device. The collector collects solar energy. The distributor is connected to the collector and guides the solar energy into a tunnel. The heat-power conversion magnetism device comprises a magnet, a sleeve and a plurality of thermal magnetic flux gate units. The magnet has a pair of magnetic poles for providing magnetic potential energy and delivering of magnetic flux. The sleeve is disposed around the magnet. Some of thermal magnetic flux gate units are heated up by the solar energy transmitted from the tunnel.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein:

FIG. 17 shows another system for converting solar energy into mechanical power by using the conversion device.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 5A:
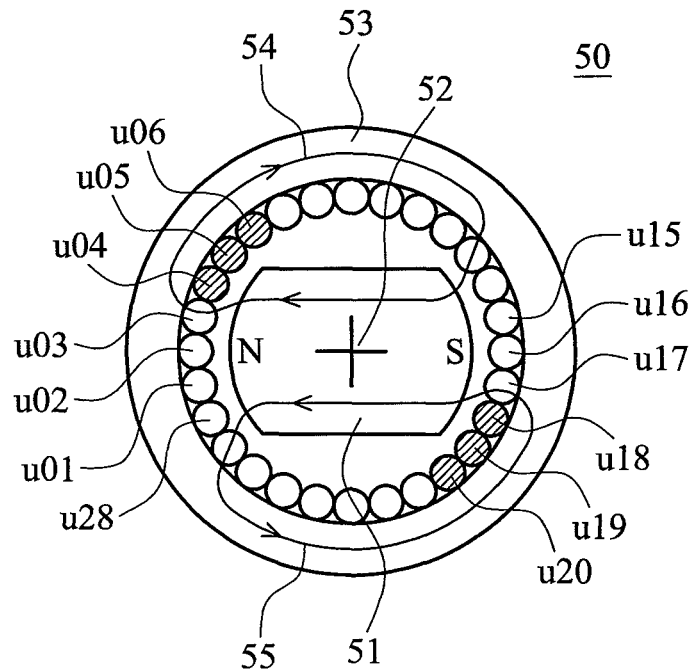
FIGS. 5A-5C show the rotating steps illustrated by the cross-sectional views of the magnet of the heat-power conversion device.

FIG. 5A shows a rotating magnet heat-power conversion device 50 according to an embodiment of the present invention. The rotating magnet heat-power conversion device 50 includes a magnet 51 which has an axis 52 and is disposed in a sleeve 53. The magnet 51 having two magnetic poles can be rotated along the axis 52. The sleeve 53 is made of a high permeable magnetic material. A plurality of magneto caloric effect material (MCEM) units u01, u02, u03, u04, u05, u06, u15, u16, u17, u18, u19, u20 and u28 are located at the inner face of the sleeve 53, i.e., the plurality of the MCEM units u01-u06, u15-u20 and u28 are arranged between the magnet 51 and the sleeve 53.

In order to rotate the magnet 51, the MCEM units u04-u06 and u18-u20, which are two groups disposed oppositely, are heated to achieve a temperature higher than the Curie temperature thereof. At the same time, the other MCEM units, except the MCEM units u04-u06 and u18-u20, are cooled to a temperature below the Curie temperature thereof. The magnetic flux generated by the N pole of the magnet 51 flows through the MCEM units, the sleeve 53 and MCEM units, and then returns to the S pole of magnet 51. Multi paths of magnetic flux are generated, but only two magnetic flux paths 54 and 55 are shown in FIG. 5A.

Since the MCEM units u04-06 and u18-u20 are heated and the magnetic moments are at low level, most of the magnetic flux paths will not flow through those MCEM units u04-06 and u18-u20. The magnetic flux paths intend to bend to the adjacent MCEM units, such as the MCEM units u01-u03 and u15-u17, whose magnetic moments are at a relative high level.

Figure 5B:
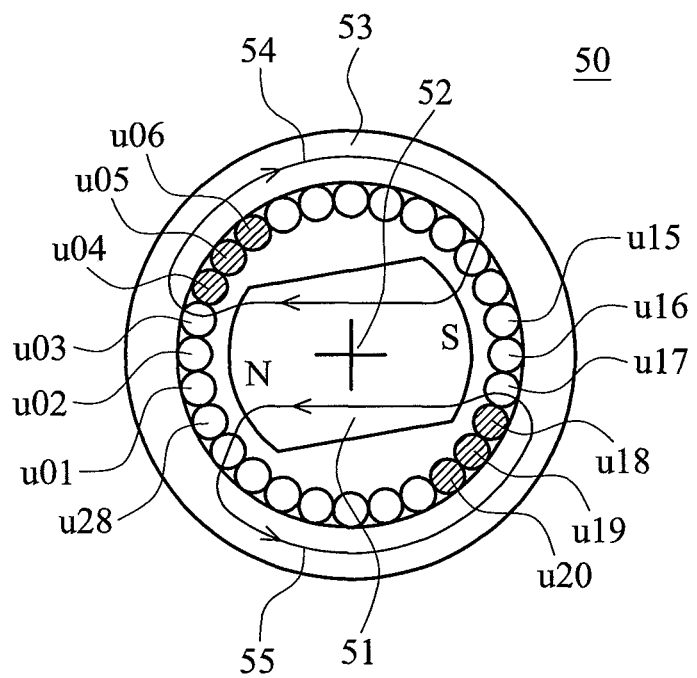

As shown in FIG. 5B, the N and S poles are attracted by the relative cooler MCEM units u01-u03 and u15-u17, thus the magnet 51 rotates in counterclockwise direction along the axis 52 and mechanical torque generated through the axis 52. After the rotation, the magnetic resistance of the device 50 is at a lower level.

Figure 5C:
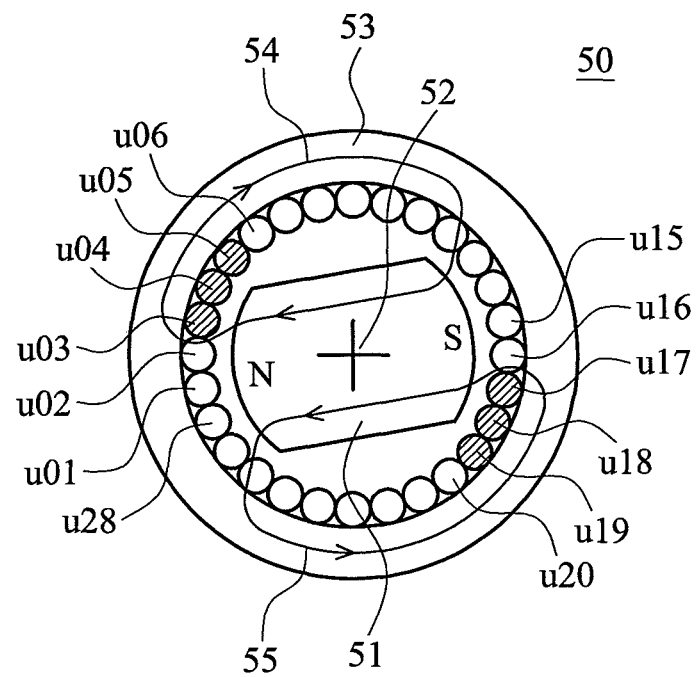

In FIG. 5C, the MCEM units u03-u05 and u17-u19 are heated to achieve a degree higher than the Curie temperature thereof. The other MCEM units, such as the MCEM units u01, u02, u06, u15, u16 and u20, are cooled to reach a temperature lower than the Curie temperature thereof. The new temperature distribution of the MCEM units increases the magnetic resistance again, and the N and S poles are attracted by the new and relative cooler MCEM units, i.e. the MCEM units u01, u02, u06, u15, u16 and u20. The magnet 52 intends to rotate in counterclockwise direction again.

Now, if locations of the heated MCEM units are rotated with the same rotation direction of the axis 52 sequentially at the same rotation speed, the magnetic poles will be attracted by those cooled MCEM units continuously. The mechanical torque is generated through the axis 52.

Figure 5D:
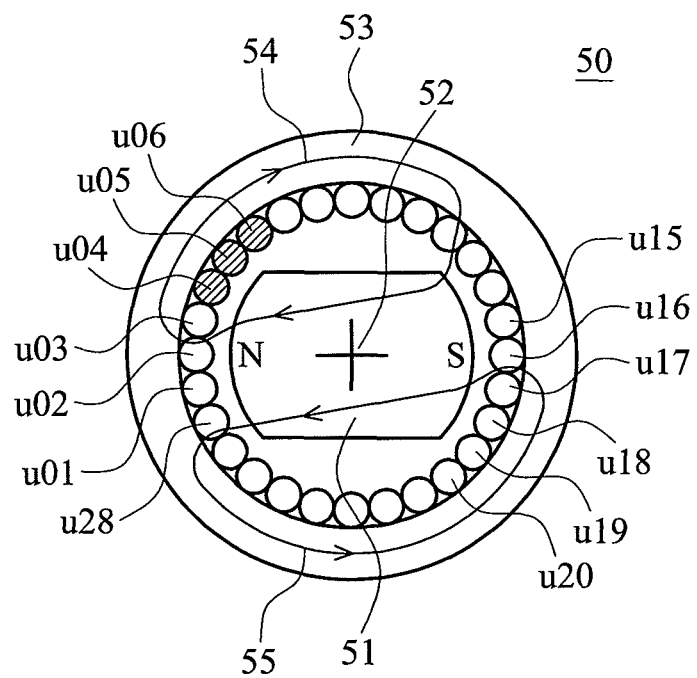
FIGS. 5D-5E show another rotating steps illustrated by the cross-sectional views of the heat-power conversion device.
Figure 5E:
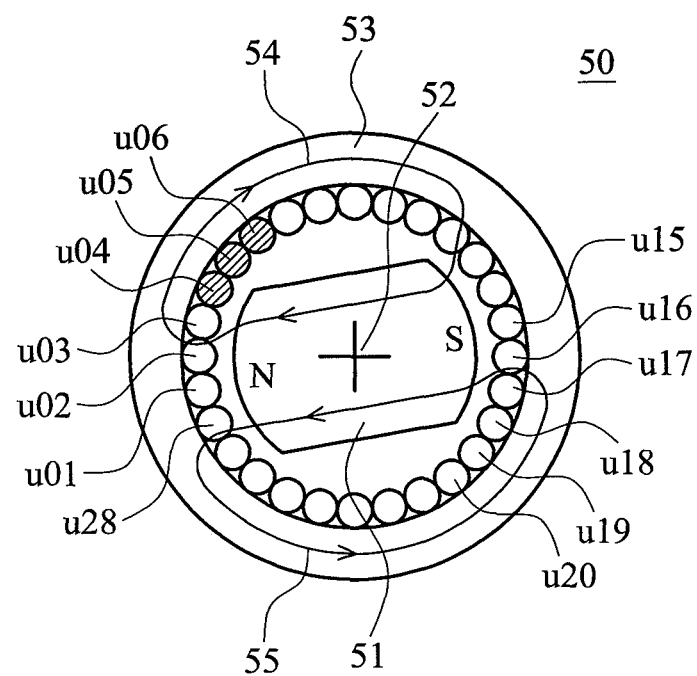

FIGS. 5D and 5E show only one group of MCEM units are heated. If the MCEM units u04-u06 in FIG. 5C are heated, the magnet 51 will still rotate in counterclockwise direction along the axis 52 but with less mechanical torque output.

It is clear to understand that, the function of the MCEM units is to control the flow of magnetic flux and furthermore to change the magnetic resistance of the device of the present invention. When the MCEM units absorb the thermal energy or expel the thermal energy and change the magnetic property thereof, it functions like a thermal magnetic flux gate (TMFG) to control the flow of magnetic flux.

The TMFG as above-mentioned can be used like a magnetic flux switch for turning the magnetic flux on or off. Also, the TMFG can be used as an analog magnetic flux valve for controlling the amount of magnetic flux analogically so that the mechanical torque can be reduced.

One example can be illustrated to explain the reason why the magnetism device of the present invention will keep looking for its lowest magnetic resistance. If we put a steel ball in a bowl, the steel ball will always try to move to the lowest location, which is similar to the lowest potential energy of the system of the present invention. When the bowl is tilted, the steel ball will move to the new lowest location again to reach its lowest potential energy of the system. That is, the magnetism device will keep the magnetic resistance at its lowest state, when we change the temperature of MCEM units that will break the balance of the magnetic resistance. To short, the magnetic device will try to move to a new state, which the magnetic resistance is the lowest.

Figure 6A:
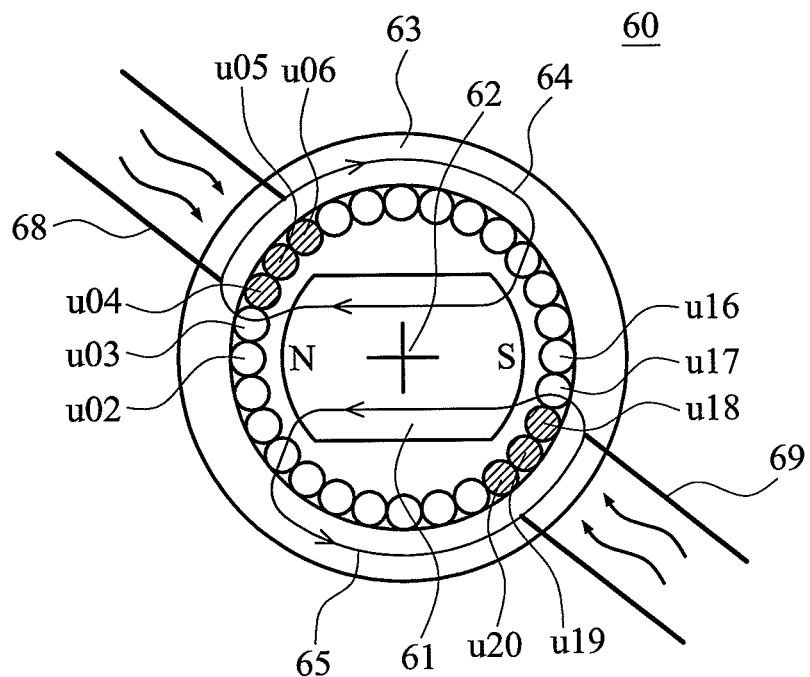
FIGS. 6A and 6B show the cross-sectional views of one embodiment of the rotating heat-power conversion device.
Figure 6B:
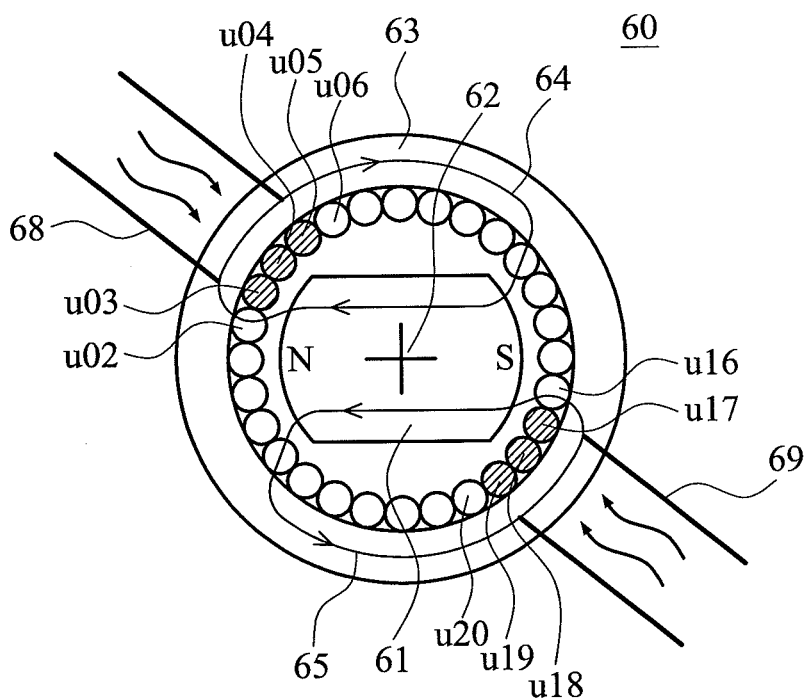

FIGS. 6A and 6B show the rotating steps of the rotating heat-power conversion device 60 using TMFGs according to another embodiment of the present invention. As shown in FIGS. 6A and 6B, the rotating heat-power conversion device 60 includes a sleeve 63 made of a high permeable magnetic material and a magnet 61 disposed therein. The magnet 61 has an axis 62 and two magnetic poles. A plurality of thermo magnetic flux gates (TMFGs) u02, u03, u04, u05, u06, u16, u17, u18, u19, u20 are located at the inner face of the sleeve 63 so that the plurality of the TMFGs u02-u06 and u16-u20 are arranged between the magnet 61 and the sleeve 63. Multi paths of magnetic flux are generated, but only two magnetic flux paths 64 and 65 thereof are shown for illustration. Two hot fluid tunnels 68 and 69 are disposed outside the sleeve 63 for heating the TMFGs.

The magnet 61 now is fixed, and the sleeve 63 with the TMFGs becomes rotatable along the axis 62, for example. The hot fluid tunnels 68 and 69 are provided stationary, and hot fluid through the tunnels provides the thermal energy to some TMFGs. The TMFGs at the exits of the tunnels 68 and 69 will be heated, and the other TMFGs are cooled by radiation and natural (or force) convection.

In FIG. 6A, the TMFGs u04-u06 and u18-u20 are located at the exits of the tunnels 68 and 69 so as to be heated. The magnetic flux force drives the sleeve 63 to rotate in the clockwise direction. When the sleeve 63 rotates to the position shown in FIG. 6B, the TMFGs u03-u05 and u17-u19 are heated so that the magnetic flux force drives the sleeve 63 to rotate in the clockwise direction continuously.

The sleeve 63 with the TMFGs will keep rotating as long as the hot fluid is supplied continuously. Continuous mechanical torque is generated through the axis 62 of the device 60. Note that the rotation direction of the sleeve 63 can be controlled by changing the tunnel exit's location.

Figure 7A:
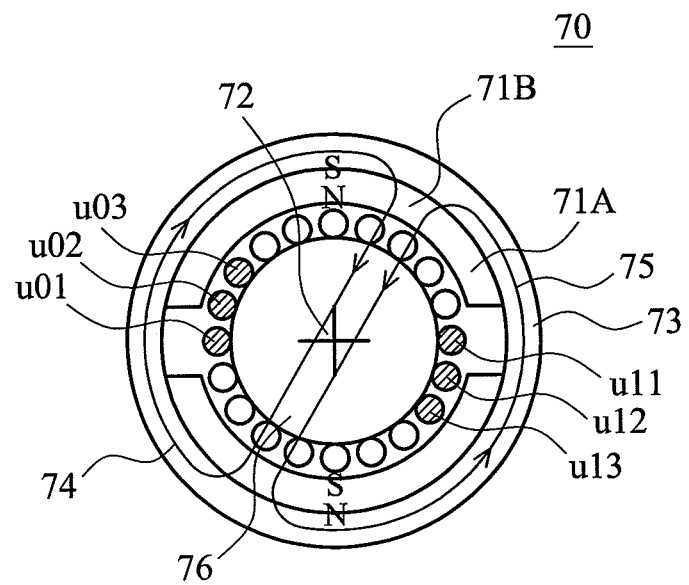
FIGS. 7A, 7B, 8, 9 and 10 show the cross-sectional views of the other embodiments of the rotating heat-power conversion devices.

FIG. 7A shows a rotating heat-power conversion device 70 using TMFGs according to another embodiment of the present invention. The device 70 includes a core 76 disposed in a sleeve 73. Both of which are made of a high permeable magnetic material. The core 76 has an axis 72, and a plurality of thermo magnetic flux gates (TMFGs) u01, u02, u03, u11, u12 and u13 are disposed around the core 76. Two magnets 71A and 71B are disposed on the inner surface of the sleeve 73 and located to each other oppositely. Multi paths of magnetic flux are generated, but only two magnetic flux paths 74 and 75 thereof are shown for illustration. Similar to the fore-mentioned principles, the core 76 with the TMFGs is fixed, and the sleeve 73 with the two magnets 71A and 71B can be rotatable when the TMFGs 701-703 and 711-713 are heated. Contrariwise, the core 76 with the TMFGs can be rotatable when the sleeve 73 with the two magnets 71A and 71B are fixed. The rotation mechanism of the device 70 is similar to that of the device 60 shown in FIGS. 6A and 6B so that the illustration thereof is omitted.

By doing this, the invention magnetism devices 50, 60, 70 can absorb the heat from heat source and generate the mechanical torque as an output. This means that we can directly convert the heat into mechanical torque, and the mechanical torque can be used to drive the electrical power generator or water pump, for example.

From fore-mentioned description, it is clear to understand, the MCEM function can be performed just like a thermal magnetic flux gate (TMFG), and so that this kind of TMFG controls the amount of magnetic flux in different magnetic flux paths. Controlling the thermal magnetic flux gate (TMFG) by thermal energy will change the amount of magnetic flux in different magnetic flux paths so that the devices 50, 60, 70 of the present invention can be driven to generate mechanical torque for all kind of applications. By using the TMFGs to control the paths of the magnetic flux as mentioned, the amount of output mechanical power is increased.

Figure 7B:
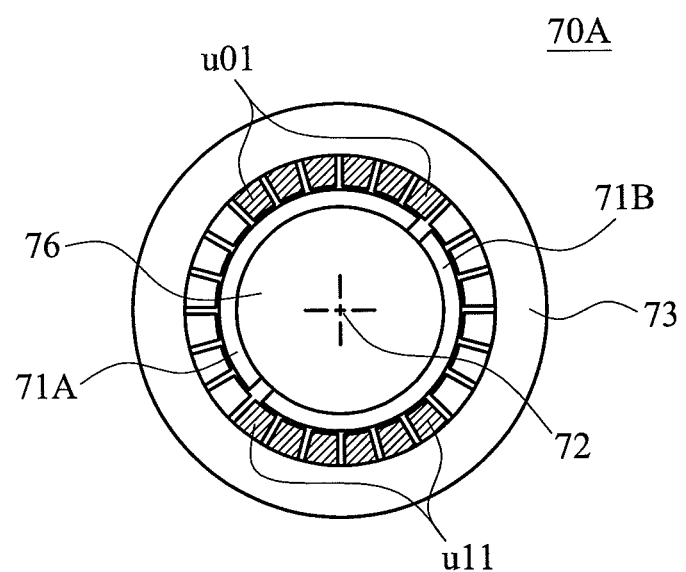

FIG. 7B shows another rotating heat-power conversion device 70A similar to the device 70 shown in the FIG. 7A. The device 70A includes a core 76 disposed in a sleeve 73. Both of which are made of a high permeable magnetic material. The core 76 has an axis 72, and a plurality of thermo magnetic flux gates (TMFGs) are disposed around the inner face of the core 76. Two magnets 71A and 71B are disposed on the outer surface of the sleeve 73 and located to each other oppositely. Similar to the fore-mentioned principles, the core 76 with the TMFGs is fixed, and the sleeve 73 with the two magnets 71A and 71B can be rotatable when the two groups of TMFGs U01 and U11 are heated. Contrariwise, the core 76 with the TMFGs can be rotatable when the sleeve 73 with the heated TMFGs is fixed. The rotation mechanism of the device 70A is similar to that of device 60 shown in FIGS. 6A and 6B so that the illustration thereof is omitted.

Figure 8:
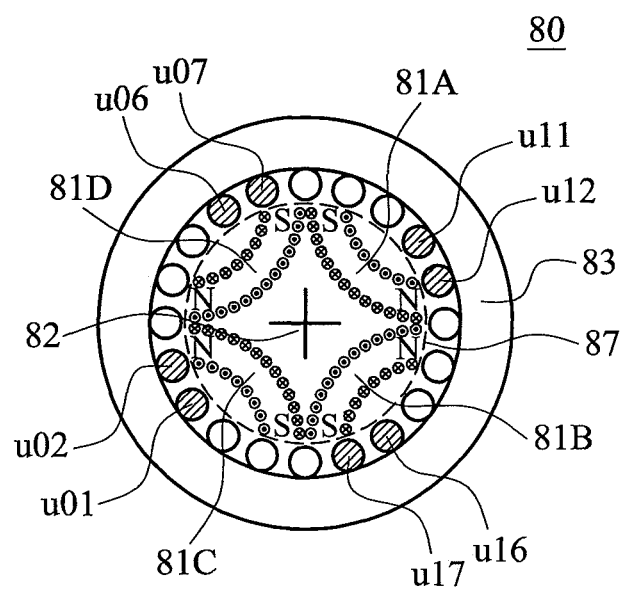

FIG. 8 shows a rotating heat-power conversion device 80 using TMFGs according to another embodiment of the present invention. The device 80 includes a sleeve 83. A plurality of thermo magnetic flux gates (TMFGs) are disposed at the inner face of the sleeve 83. A thermal insulation shield 87 is disposed at the center of the sleeve 83, and several superconductor coil magnets are disposed in the thermal insulation shield 86 so that the plurality of TMFGs are located between the sleeve 83 and the superconductor coil magnets. For example, twenty TMFGs and four superconductor coil magnets 81A, 81B, 81C and 81D are shown in FIG. 8, respectively. Eight TMFGs u01, u02, u06, u07, u11, u12, u16 and u17, which are marked shadow, are heated and the superconductor coil magnets 81A-81D are fixed. The sleeve 83 is rotatable in counterclockwise direction along an axis 82 of the thermal insulation shield 87. The rotation mechanism of the device 80 is similar to fore-mentioned description so that the illustration thereof is omitted.

The benefits of using superconductor coil magnets are: (1) much higher magnetic field density, for example higher than 5 Tesla, can be generated; and (2) magnetic field density is controllable by changing the electrical current.

Figure 9:
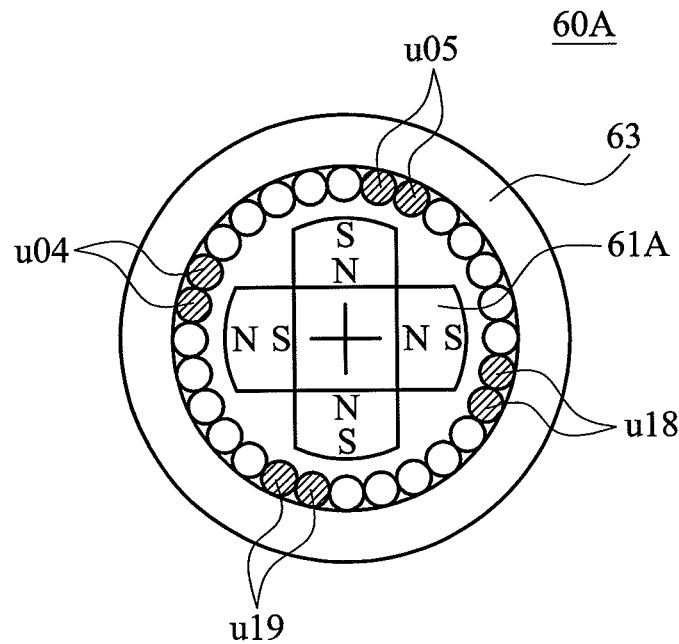

FIG. 9 shows a rotating heat-power conversion device 60A according to another embodiment of the present invention. The device 60A is similar to the device 60 shown in FIGS. 6A and 6B. The difference is that the device 60A includes a magnet 61A with four poles and four regions of the plurality of TMFGs thereof, for example the TMFGs u04, u05, u18 and u19 with shadow marks, are heated. The rotation mechanism of the device 60A is the same as that of device 60 so that the illustration thereof is omitted.

Figure 10:
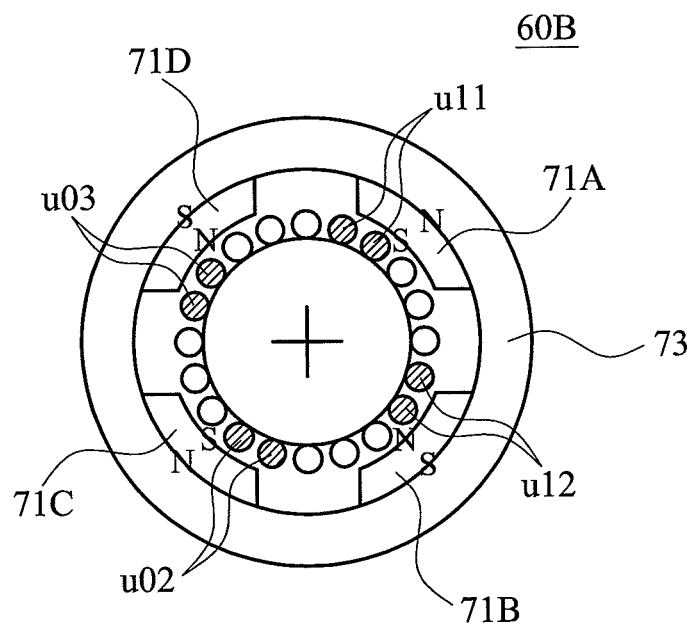

FIG. 10 shows a rotating heat-power conversion device 70B according to another embodiment of the present invention. The device 70B is similar to the device 70 shown in FIG. 7A. The difference is that the device 70B includes 4 magnets 71A, 71B, 71C and 71D disposed on the inner surface of the sleeve 73 and four regions of the plurality of TMFGs thereof, for example the TMFGs u02, u03, u11 and u12 with shadow marks, are heated. The rotation mechanism of the device 70B is the same as that of device 70 so that the illustration thereof is omitted.

Figure 11A:
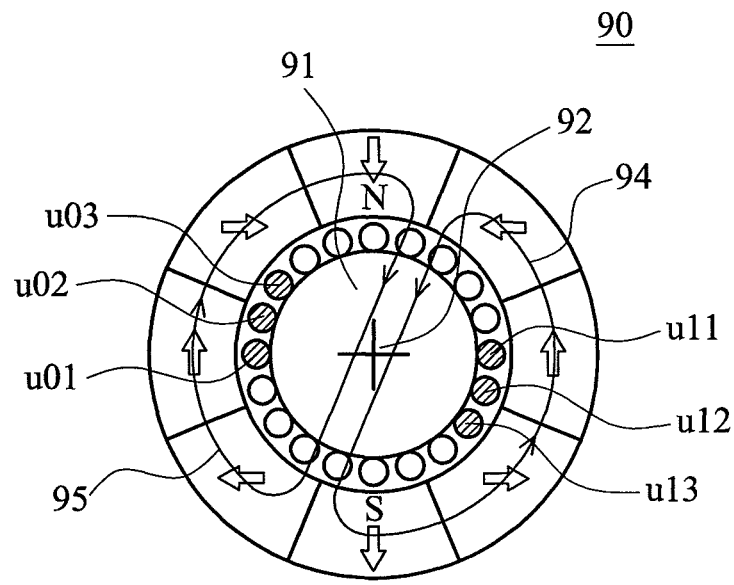
FIGS. 11A-11C show the cross-sectional views of the other embodiment of the rotating heat-power conversion device.

FIG. 11A shows a rotating heat-power conversion device 90, which takes an embodiment of a permanent magnet array as magnetic field source.

The device 90 includes a Halbach magnet ring 93 which is a kind of permanent magnet array with eight segments with their own special magnetization vectors as the arrows indicated in FIG. 11A. A magnet 91 made of a permeable magnetic material is disposed in the center space of the Halbach magnet ring 93. The Halbach magnet ring 93 has an axis 92. A plurality of TMFGs are disposed at the outer surface of the magnet 91, and the TMFGs u01, u02, u03, u11, u12 and u13 are heated. Multi paths of magnetic flux are generated, but only two magnetic flux paths 94 and 95 thereof are shown in FIG. 11A.

The Halbach magnet ring 93 can enhance the center magnetic field strength, and the segments thereof can guide most of magnetic flux paths through the center space of the Halbach magnet ring 93 to provide a stronger magnetic flux with density to 2-3 Tesla. The magnetic flux density is presented as the following equation:

$$B = Br * (ln(Ro/Ri)) \quad (4)$$

wherein B is the magnetic flux density; Br is the remanence of the material of the Halbach magnet ring 93; Ro is the radius of outer dimension of the Halbach magnet ring 93; and Ri is the radius of inner dimension of the Halbach magnet ring 93.

As mentioned above, sequentially changing the temperature of the TMFGs disposed around the magnet 91 can convert heat into mechanical torque. The magnet 91 with the TMFGs is fixed, and the Halbach magnet ring 93 can be rotatable alone the axis 92. Contrariwise, the magnet 91 with the TMFGs can be rotatable when the Halbach magnet ring 93 is fixed.

Figure 11B:
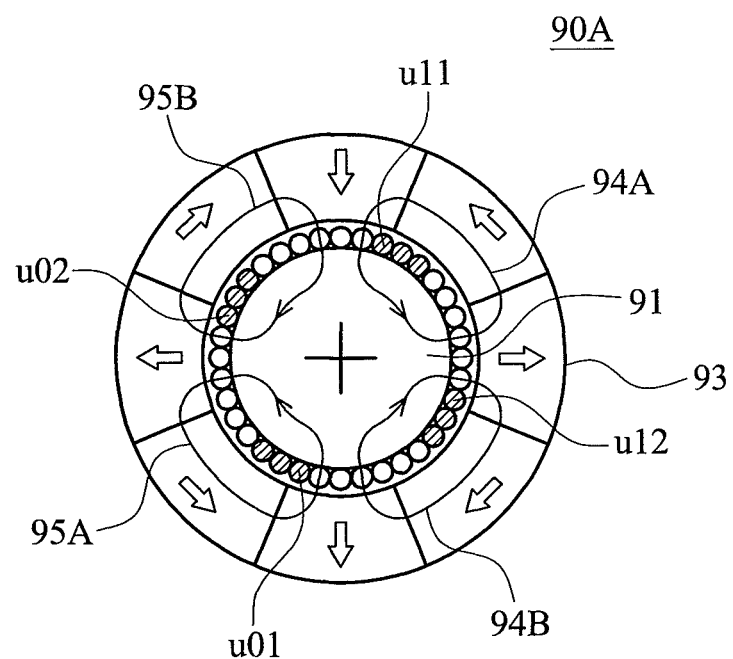

FIG. 11B shows a rotating heat-power conversion device 90A, which is a variation of the device 90 shown in FIG. 11A. The device 90A is similar to the device 90, and the difference is that the four regions of the plurality of TMFGs, for example the TMFGs U01, U02, U11 and U12 with shadow marks shown in FIG. 11B, are heated. Multi paths of magnetic flux are generated, but only four magnetic flux paths 94A, 94B, 95A and 95B thereof are shown in FIG. 11B.

Figure 11C:
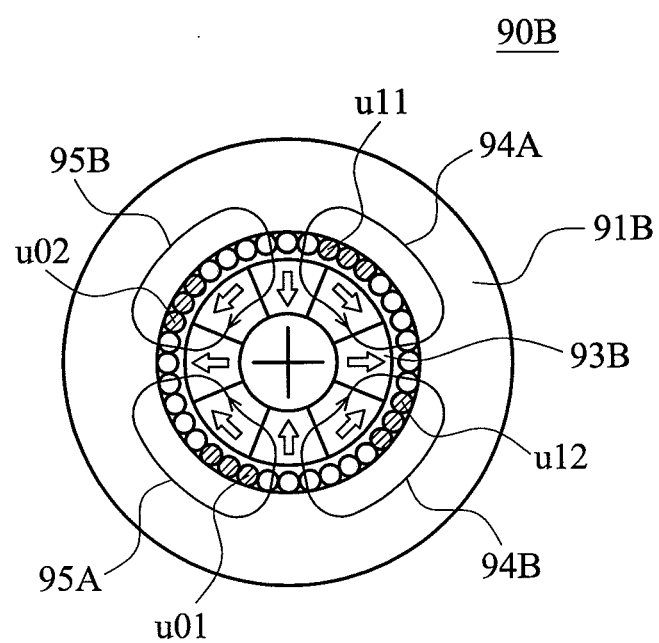

FIG. 11C shows a rotating heat-power conversion device 90B, which is the other variation of the device 90A. The device 90B is similar to the device 90A and the difference is that a Halbach magnet 93B is disposed at the center space of a magnet ring 91B, and that the plurality of TMFGs, for example the TMFGs u01, u02, u11 and u12 with shadow marks, are disposed at the inner face of the magnet ring 91B and heated. Multi paths of magnetic flux are generated, but only four magnetic flux paths 94A, 94B, 95A and 95B thereof are shown in FIG. 11C.

The rotation mechanisms of the devices 90A and 90B are the same as that of the device 90 so that the illustrations thereof are omitted.

Figure 12B:
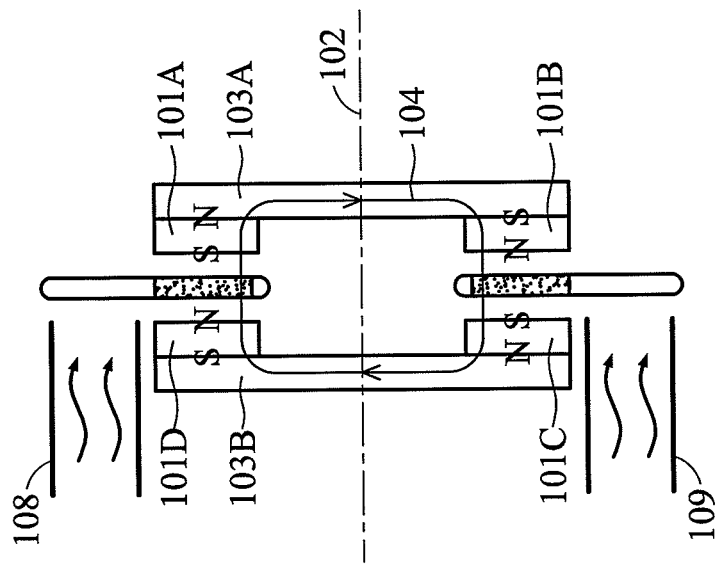
FIGS. 12A and 12B show the front view and side view of the other embodiment of the rotating heat-power conversion device, respectively.
Figure 12A:
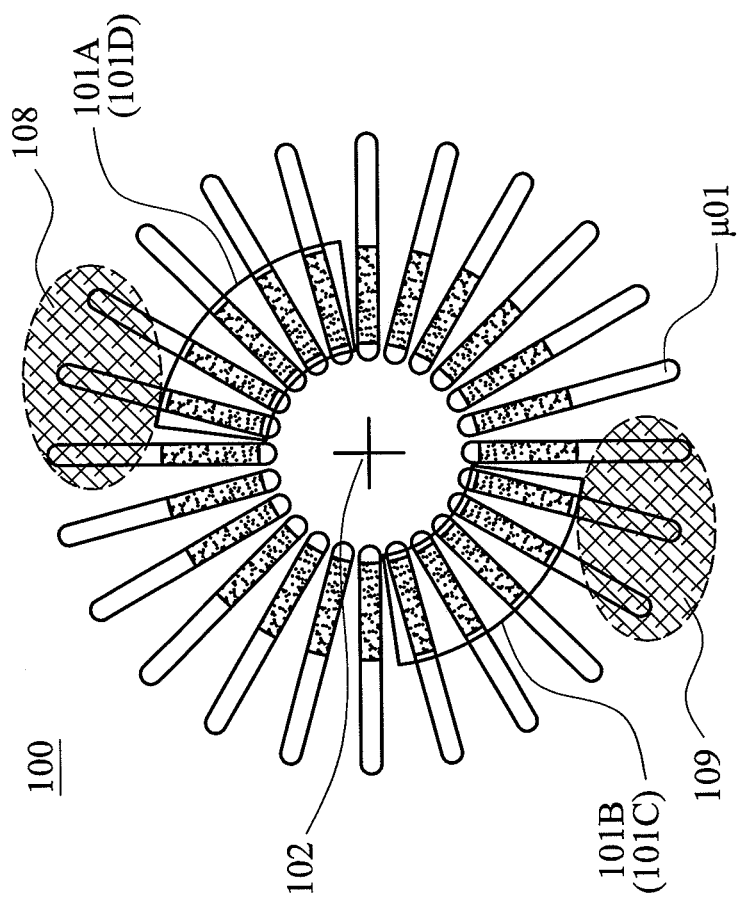

FIGS. 12A and 12B show the front and side views of a rotating heat-power conversion device 100, respectively. As shown in FIGS. 12A and 12B, twenty-four TMFG units μ01 are disposed in a ring (not shown) and arranged in annual shape with an axis 102. Two magnets 101A and 101B are disposed at one side of the set of the TMFG units μ01, and the other two magnets 101C and 101D are disposed at another side of the set of the TMFG units μ01. The two magnets 101A and 101D are disposed to each other oppositely, and the other two magnets 101B and 101C are disposed to each other oppositely, too. A magnetic conductive member 103A is connected to the magnets 101A and 101B, and a magnetic conductive member 103B is connected to the magnets 101C and 101D. Multi paths of magnetic flux are generated, for example the path 104 is shown. Two heat zones 108 and 109 are located oppositely to each other. The TMFG units located in the two heat zones 108 and 109 can be heated. The TMFG units, which are not located in the heat zones, can be cooled by natural radiation or forced convection. Such arrangement will force the TMFG units μ01 rotate in counterclockwise direction to generate mechanical torque through the axis 102.

Figure 12C:
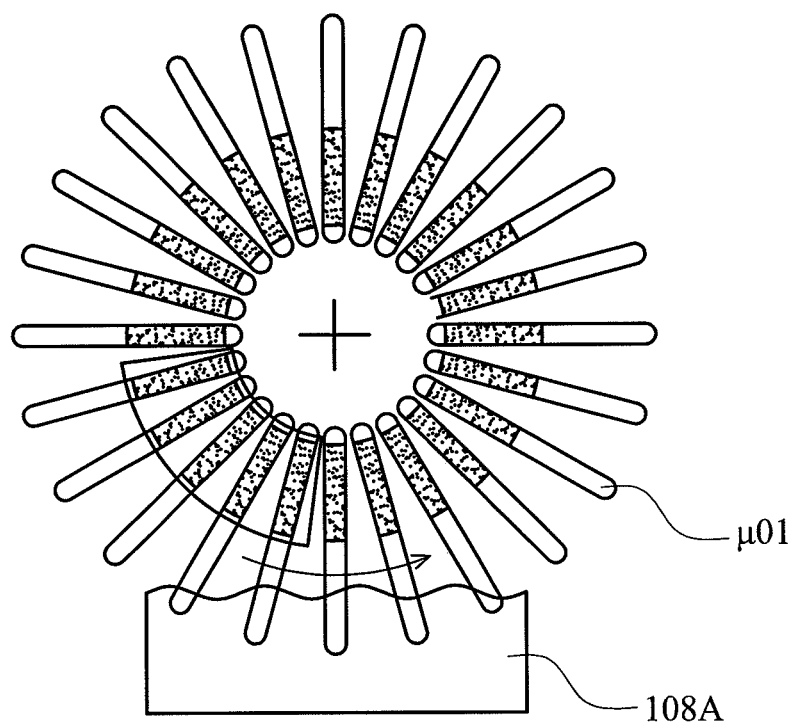
FIG. 12C shows a variation embodiment of the rotating heat-power conversion device shown in FIG. 12A.

FIG. 12C shows a variation of the device 100, the heat zone can be a single hot water tank 108A. The hot water tank 108A provides a thermal source to heat up the TMFG units to a temperature above the Curie temperature thereof. The variation of the device 100 can be self-starting and self-rotating, as long as the temperature of the TMFG units μ01 is higher than the Curie temperature thereof. The hot water can be produced by solar power, geothermal power, or chemical process.

Figure 13A:
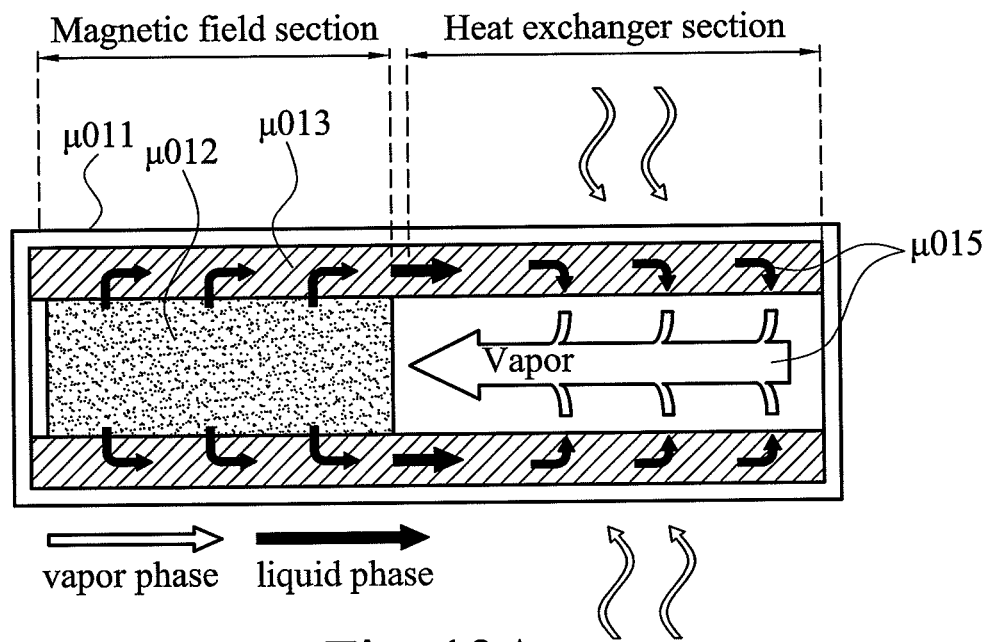
FIGS. 13A and 13B show the TMFG unit of FIGS. 12A and 12B in detail.
Figure 13B:
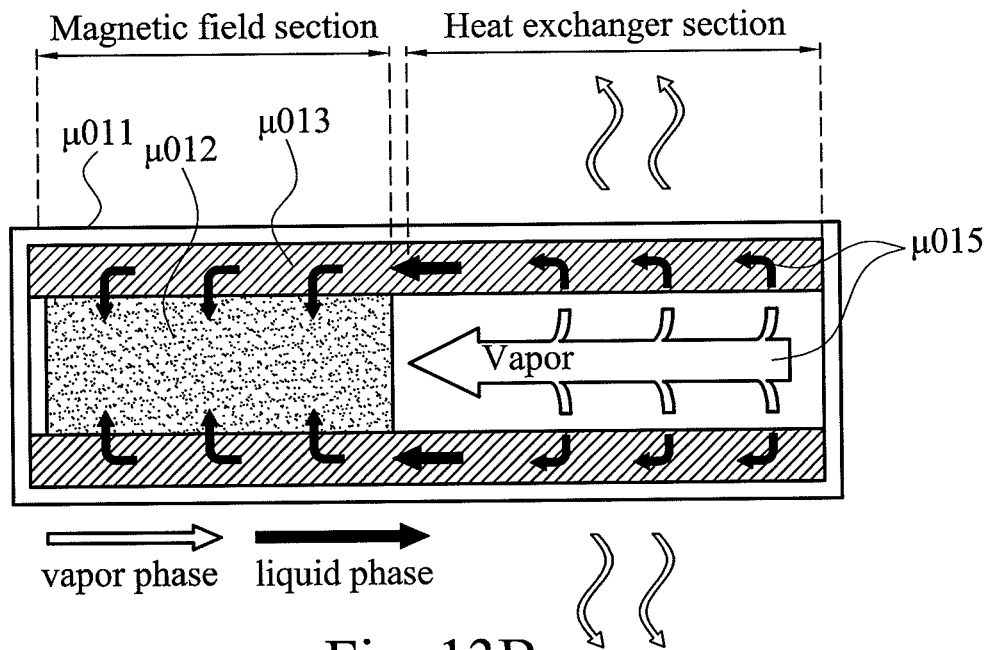

FIGS. 13A and 13B show the heat absorption stage and heat expenditure stage of the TMFG unit μ01, respectively. Referring to FIGS. 13A and 13B, the TMFG unit μ01 whereby is a two-phase flow thermal convection unit and the unit includes a container μ011 sealed with a porous structure μ012 and heat exchanging working fluid μ015. A wick structure μ013 is disposed at the inner surface of the container μ011. The porous structure μ012 is made of MCEM. The container μ011 is vacuumed and then a proper amount of working fluid μ015 is injected into the container μ011, and then the container μ011 is sealed. Both of the porous structure μ012 and the wick structure μ013 will be filled with the working fluid μ015 by performing capillary attraction force. The tiny space inside of the porous structure μ012 and MCEM are filled by the working fluid μ015.

Since the working fluid μ015 is under a vacuum environment, part of the working fluid μ015 is vaporized, and the empty space of container μ011 is filled with the working fluid μ015. The process of vaporization will be stopped when the vapor pressure comes to the saturation point of the working fluid μ015. The amount of vapor and liquid tends to maintain such a balance status will be set until the temperature of the working fluid μ015 is changed. When the temperature of TMFG rises up and the working fluid μ015 is heated, part of the working fluid μ015 in liquid status is vaporized, and this part of vaporized working fluid μ015 come into a higher vapor pressure status. When the temperature of TMFG cools down and the working fluid μ015 is cooled, part of the working fluid μ015 in vapor status is condensed, and this part of vaporized working fluid μ015 come into a lower vapor pressure status.

Referring to FIGS. 12A and 13A, when the heat exchanger section of the TMFG unit μ01 is located at the heat zone 108, heat is absorbed from the heat exchanger section and transferred by the wick structure μ013 so that the temperature of the porous structure μ012 is raised. When the temperature of the wick structure μ013 rises over Curie temperature thereof and then loses its ferromagnetism property, less attraction force is inducted by the magnetic field accordingly.

When the heat exchanger section of the TMFG unit μ01 is moved away from the heat zone 108, the heat exchanger section no longer absorbs any heat. The heat of the porous structure μ012 at the magnetic field section is then transferred to the heat exchanger section and expelled to the environment by thermal convection and radiation. The porous structure μ012 is cooled to the temperature below its Curie temperature, and the magnetic property is changed. Large attraction force is inducted by the magnetic field accordingly.

The processes of the heat absorption and heat expenditure stages shown in FIGS. 13A and 13B, respectively, are happened to be seen as a different two-phase flow thermal convection unit, and a continuous torque is generated through the axis 102 in FIG. 12A.

A type of Active Magnetic Regenerator (AMR) thermal convection unit according to an embodiment of the invention is presented as below. In AMR cycle, the magneto caloric effect material (MCEM) is not only a magnetic refrigerant but also a regenerator material. Thus the irreversible thermal loss can be reduced.

FIGS. 14A, 14B, 14C and 14D show the back-and-forth processes of a regeneration thermal convection unit μ100. The thermal convection unit μ100 includes a container μ011, a hot side chamber μ016 and a cold side chamber μ017. A porous structure μ012 made of MCEM is disposed in the container μ011. The hot side and cold side chambers μ016, μ017 are connected to the container μ017, respectively, so that a working fluid μ015 can flow between the container μ011 and the hot side and cold side chambers μ016 and μ017.

Figure 14A:
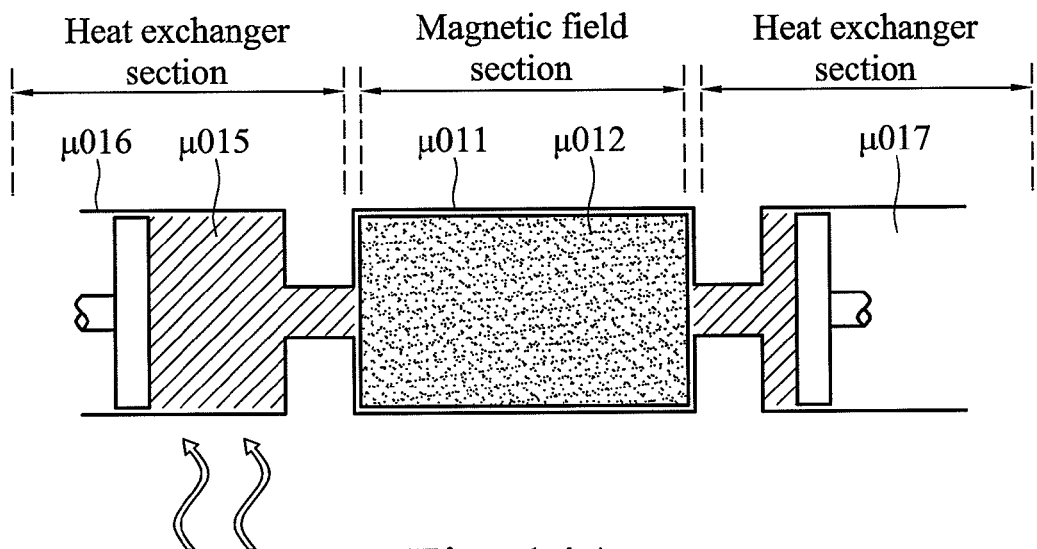
FIGS. 14A-14D show the back-and-forth processes of a regeneration thermal convection unit.
Figure 14B:
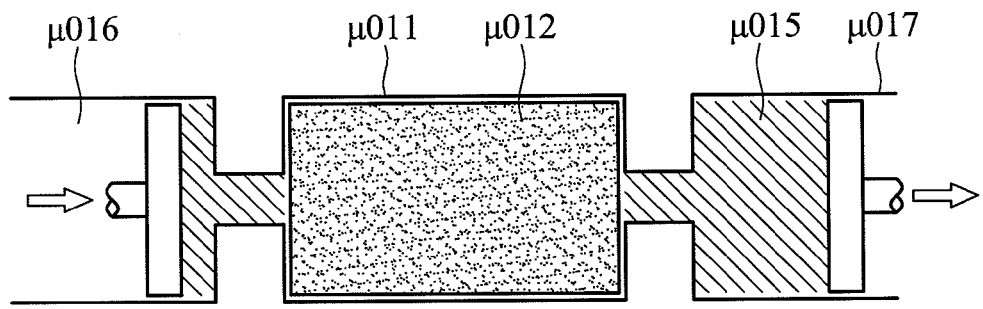
Figure 14C:
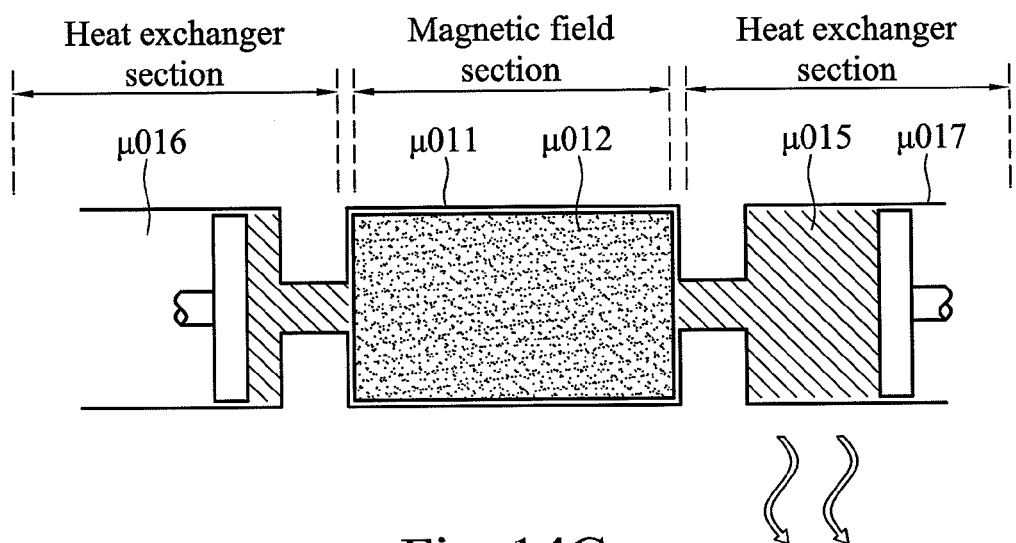
Figure 14D:
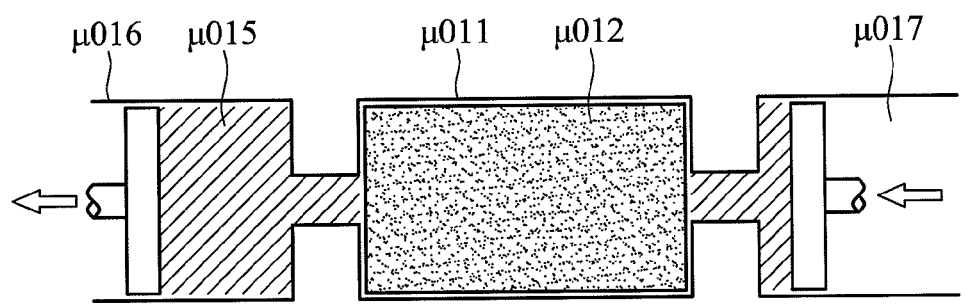

As shown in FIG. 14A, hot thermal energy is applied to the hot side chamber μ016 so that the working fluid μ015 in the hot side chamber μ016 can be heated. In FIG. 14B, the heated working fluid μ015 is pushed through the porous structure μ012 so that the magnetic field thereof can be changed. In FIG. 14C, cold thermal energy is applied to the cold side chamber μ017, and then the working fluid μ015 in the cold side chamber μ017 can be cooled. In FIG. 14D, the cooled working fluid μ015 is pushed through the porous structure μ012 again so that the magnetic field thereof can be changed again.

FIGS. 15A, 15B, 15C and 15D show the back-and-forth processes of a regeneration thermal convection unit μ010. The regeneration thermal convection unit μ110 is similar to the unit μ100 shown in FIGS. 14A-14D. The difference is that the porous structures are formed by MCEM with different Curie Temperatures. Porous structures μ022, μ023, μ024 and μ025 are disposed in the container μ011 and arranged in sequence. The porous structures μ022, μ023, μ024, μ025 have Curie Temperatures Tc1, Tc2, Tc3 and Tc4, respectively, and the relationship of degrees of temperatures thereof is Tc1>Tc2>Tc3>Tc4.

When the working fluid μ015 is pushed between the hot side and cold side chambers μ016, μ017, a temperature gradient is generated along the flowing direction. When the working fluid μ015 is pushed from the hot side chamber μ016 to the cold side chamber μ017, the temperature of each of porous structures μ022-μ025 is higher than Curie Temperature thereof. When the working fluid μ015 is pushed from the cold side chamber μ017 to the hot side chamber μ016, the temperature of each of porous structures μ022-μ025 is lower than Curie Temperature thereof.

Figure 15A:
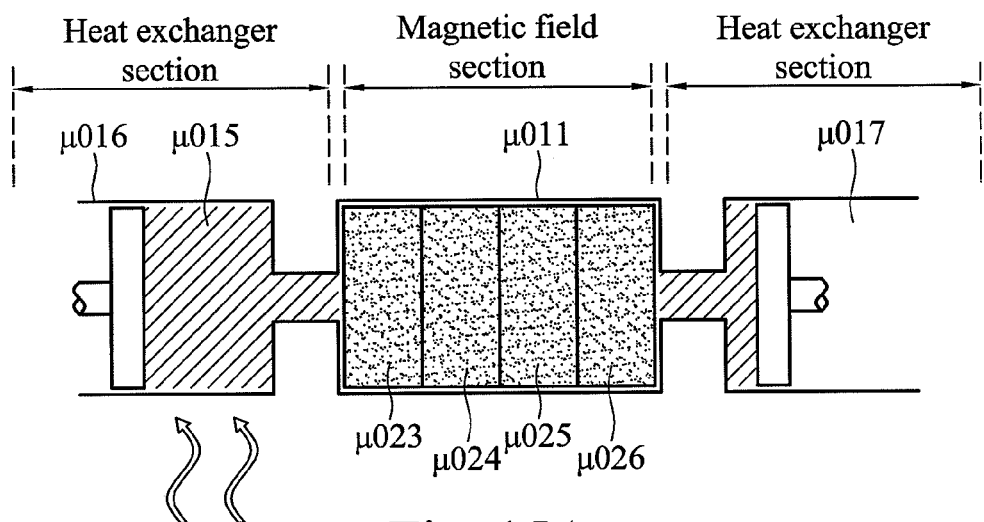
FIGS. 15A-15D show the back-and-forth processes of another regeneration thermal convection unit.
Figure 15B:
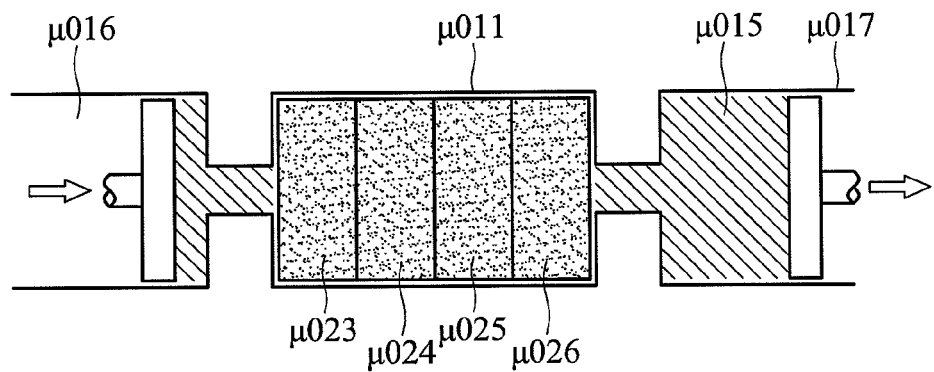
Figure 15C:
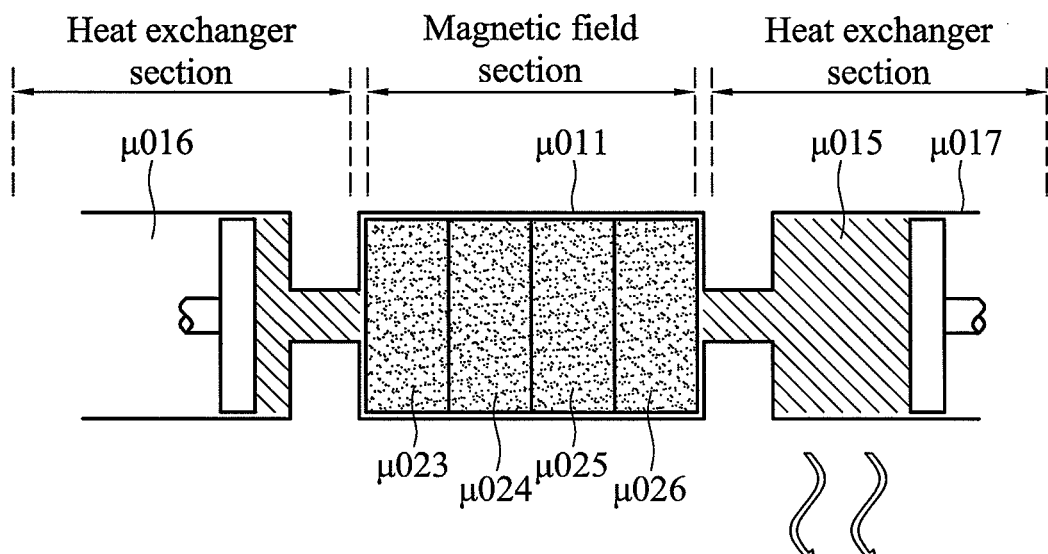
Figure 15D:
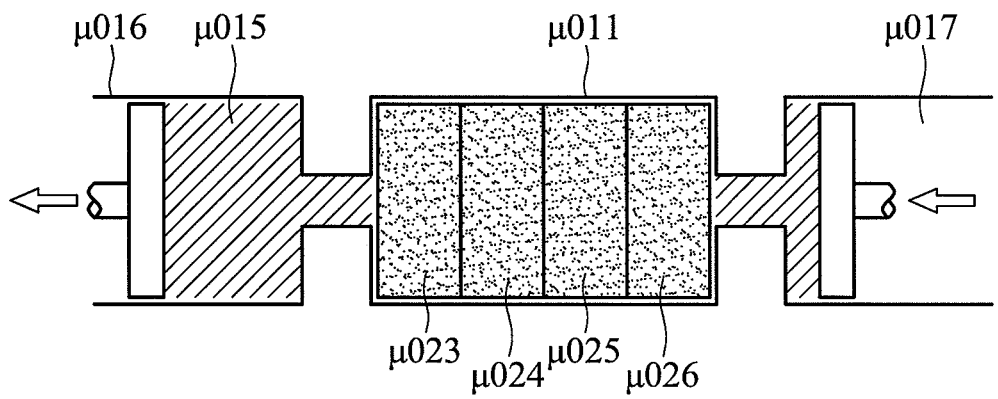
Figure 15E:
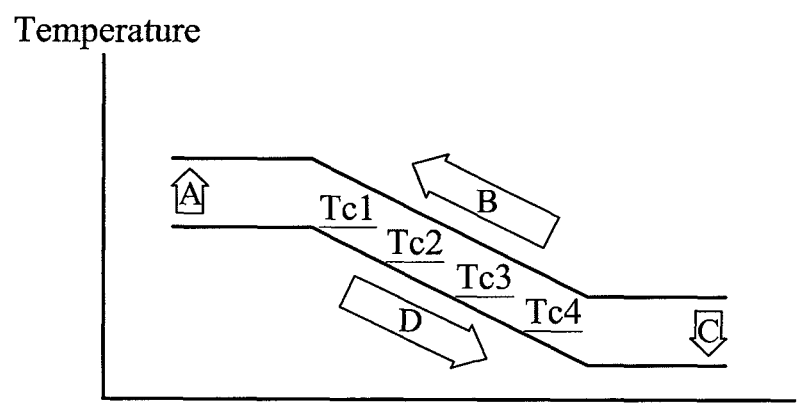
FIG. 15E shows the Curie Temperatures of the different porous structures in the regeneration thermal convection unit shown in FIGS. 15A-15D.

FIG. 15E shows the Curie Temperatures of the different porous structures in the regeneration thermal convection unit μ110 shown in FIGS. 15A-15D. The arrows A, B, C and D correspond to the temperature changes shown in FIGS. 15A-15D, respectively.

The regeneration thermal convection unit μ110 requires less thermal energy to change the temperature of the porous structures μ022-μ025 and also requires less amount of the working fluid μ015 to flow through the porous structure μ022-μ025 in comparison with the regeneration thermal convection unit μ100.

Figure 16:
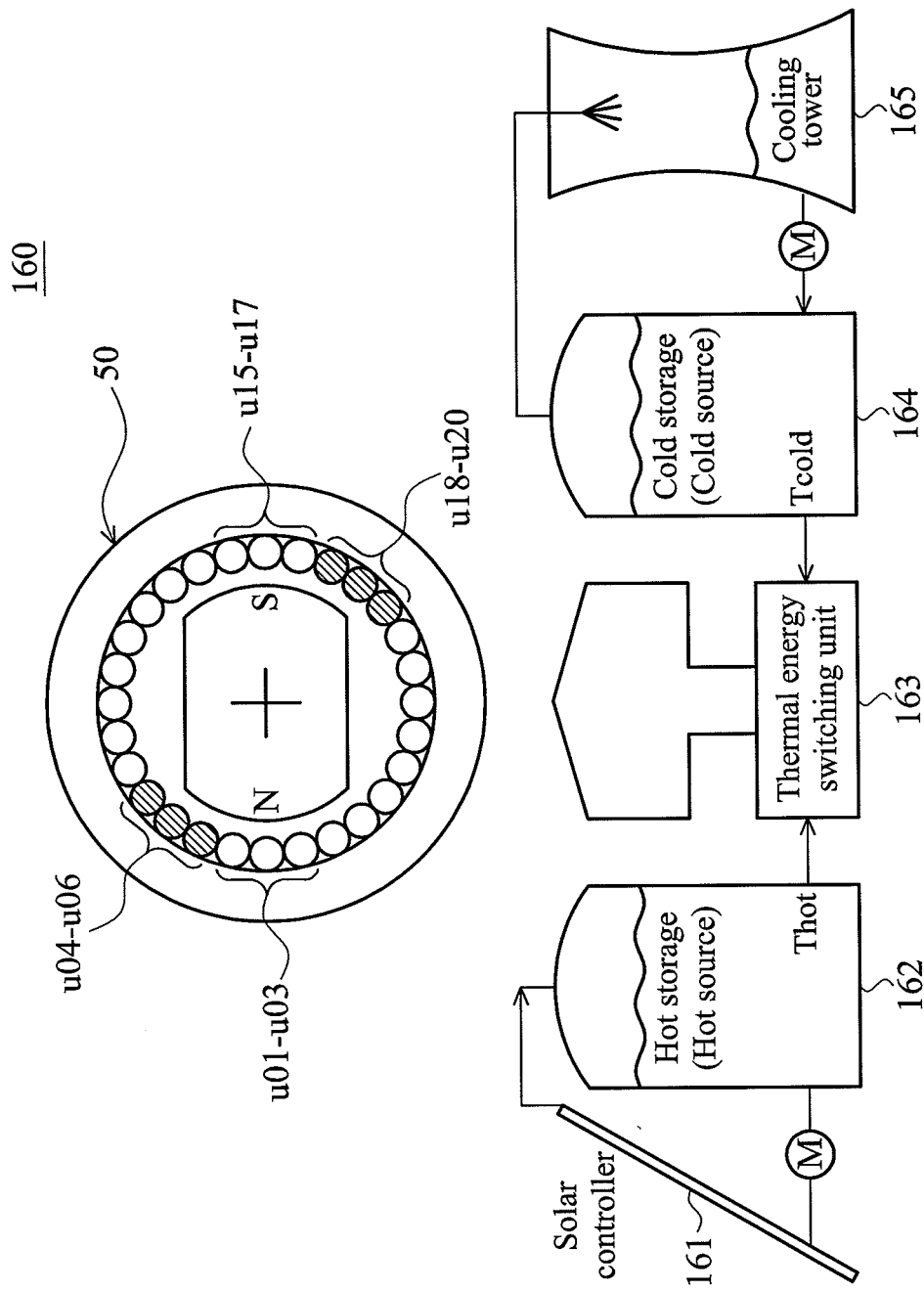
FIG. 16 shows a system for converting solar energy into mechanical power by using the conversion device.

A schematic drawing in FIG. 16 shows a system 160 for converting solar energy into mechanical power by using the conversion device according to the fore-mentioned embodiments of the present invention. As shown in the drawing, the unit can be the rotating magnet heat-power conversion device 50 or anyone of the fore-mentioned devices. The solar energy is absorbed by a solar collector 161 and stored in a hot storage 162, and the hot storage 162 is such as a hot water tank. Heated refrigerant, which can be water, in the hot storage 162 is heated to reach temperature $T_{hot}$ and pumped to the conversion device 50 through a thermal energy switching unit 163. A cooling tower 165 is used for cooling down heat refrigerant at the temperature $T_{cold}$. Cooled heat refrigerant is stored in a cold storage 164 and pumped to the conversion device 50 through the thermal energy switching unit 163. The thermal energy switching unit 163 receives heat refrigerant with different temperatures $T_{hot}$ and $T_{cold}$ and controls the output of heat refrigerant, and the conversion device 50 can be rotated as illustrated before. Generally, temperature $T_{hot}$ is higher than the Curie Temperature of TMFG and temperature $T_{cold}$ is lower than the Curie Temperature of the TMFG. The conversion device 50 in the system 160 turns the thermal energy from the hot storage 162 and cold storage 164 into a mechanical rotation output.

FIG. 17 shows another embodiment of the system for converting solar energy into mechanical power by using the conversion device. A system 170 includes a collector 171 for collecting solar energy. A distributor 172 is connected to the collector 171 and guides the solar energy into two tunnels 68A and 69A to heat some MCEM units of a conversion device. As shown in the drawing, the conversion device is the rotating heat-power conversion device 60 and not limited to the device 60 only. The rotation mechanism can be found in the illustration of FIGS. 6A and 6B.

Figure 1:
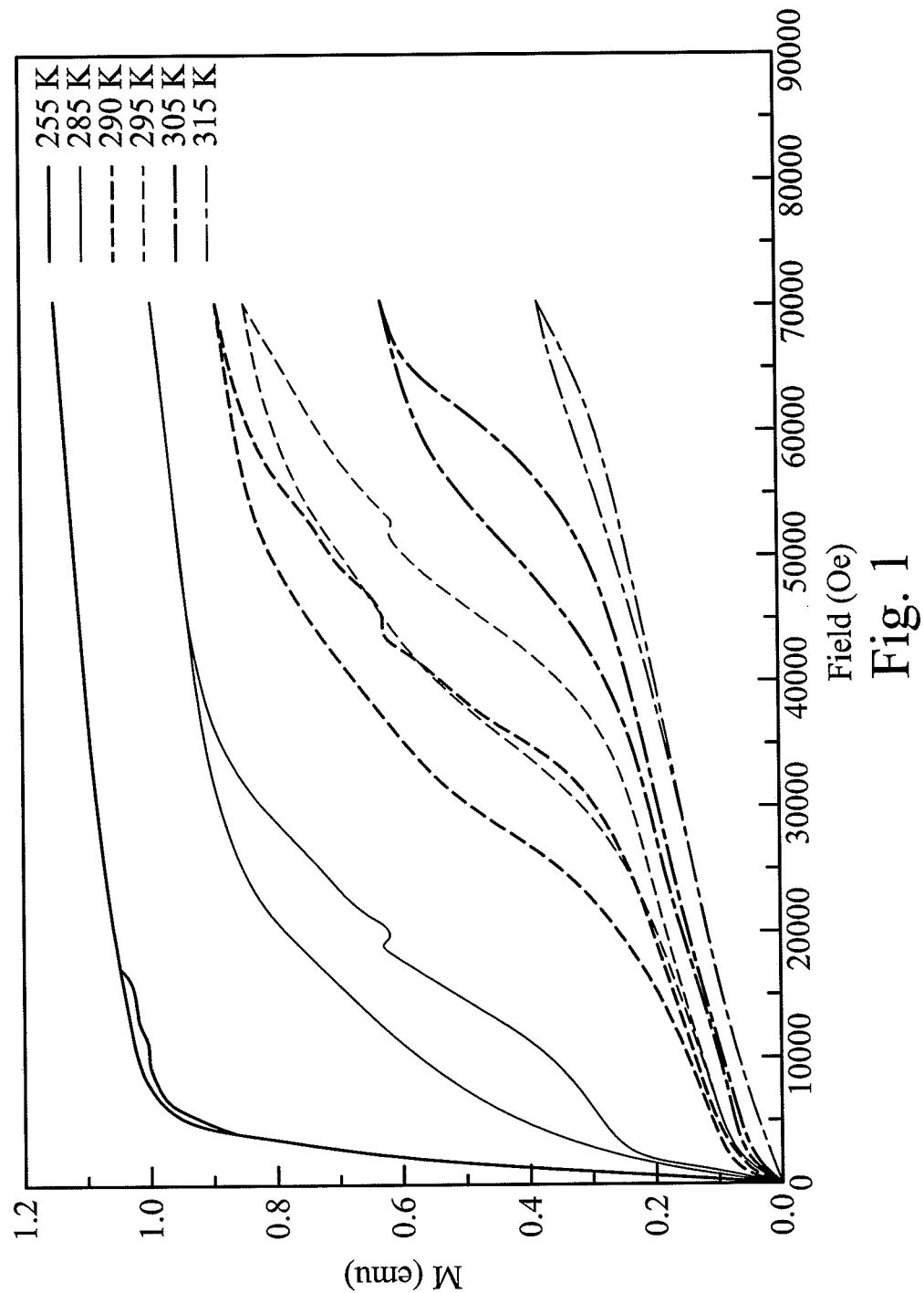
FIG. 1 shows magnetization curves of Gadolinium (Gd)
Figure 2:
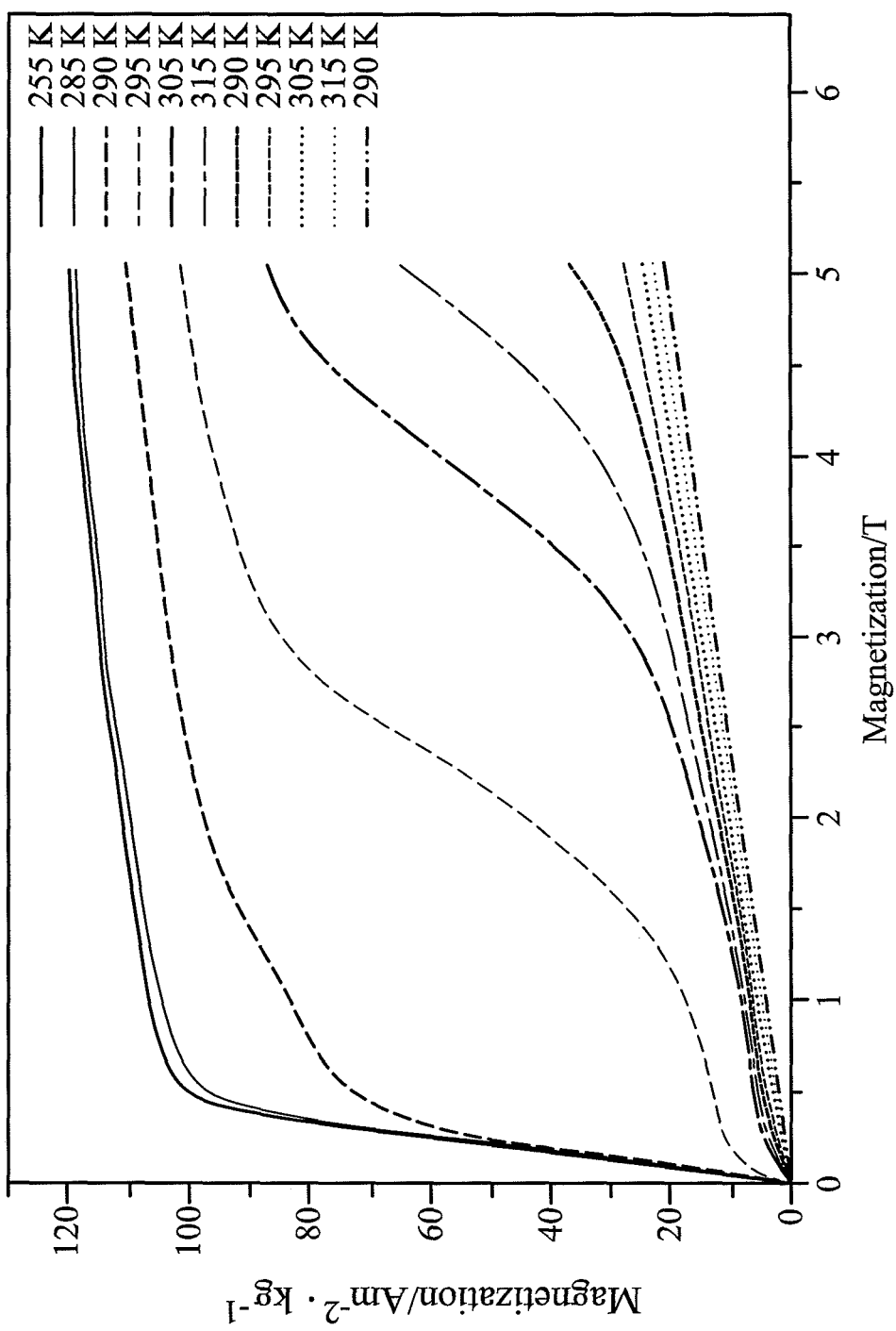
FIG. 2. shows magnetization curves of $Gd_5Si_2Ge_2$.
Figure 3:
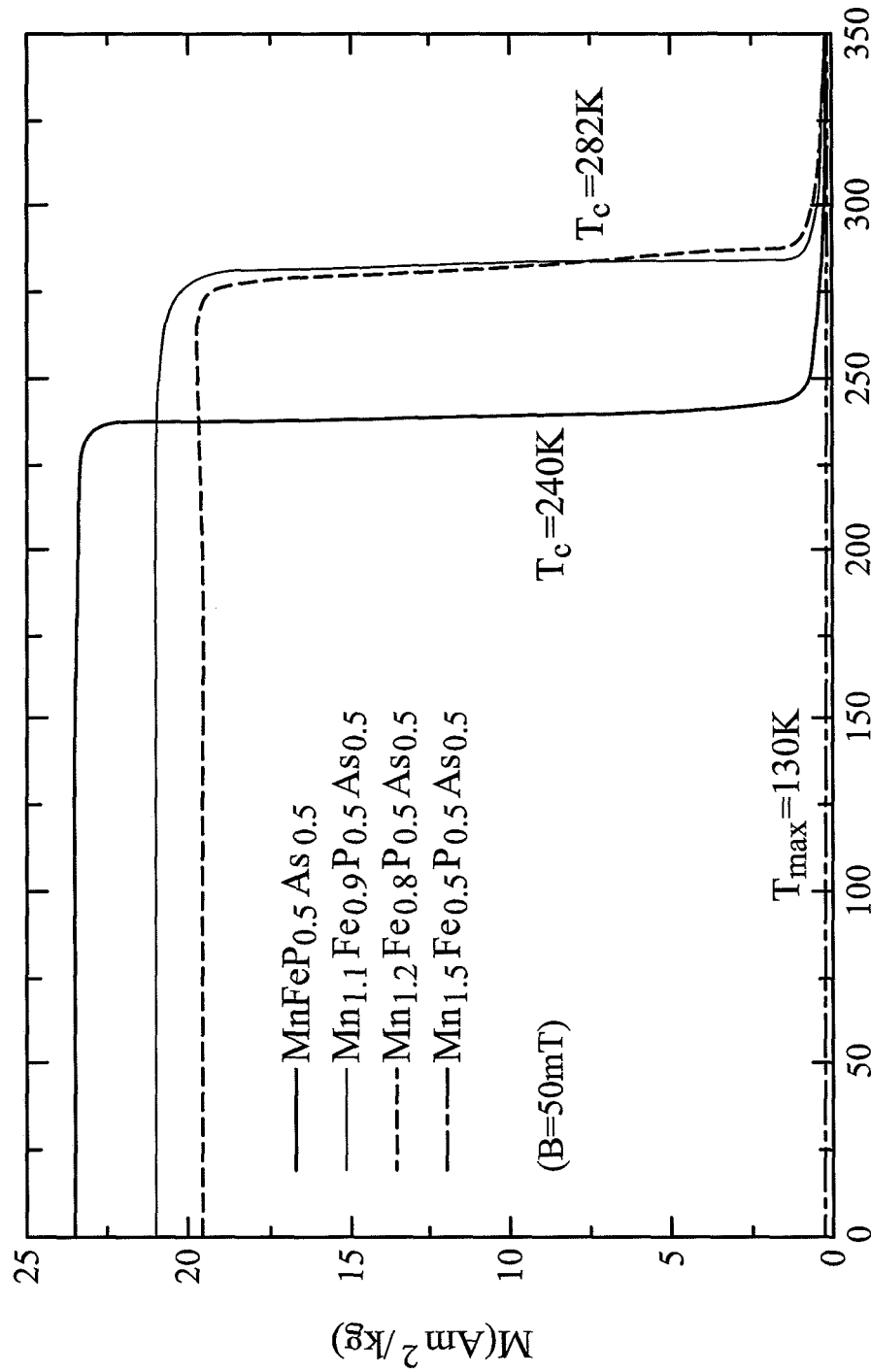
FIG. 3. shows magnetization curves of $(Mn, Fe)_2P_{0.5}As_{0.5}$.
Figure 4:
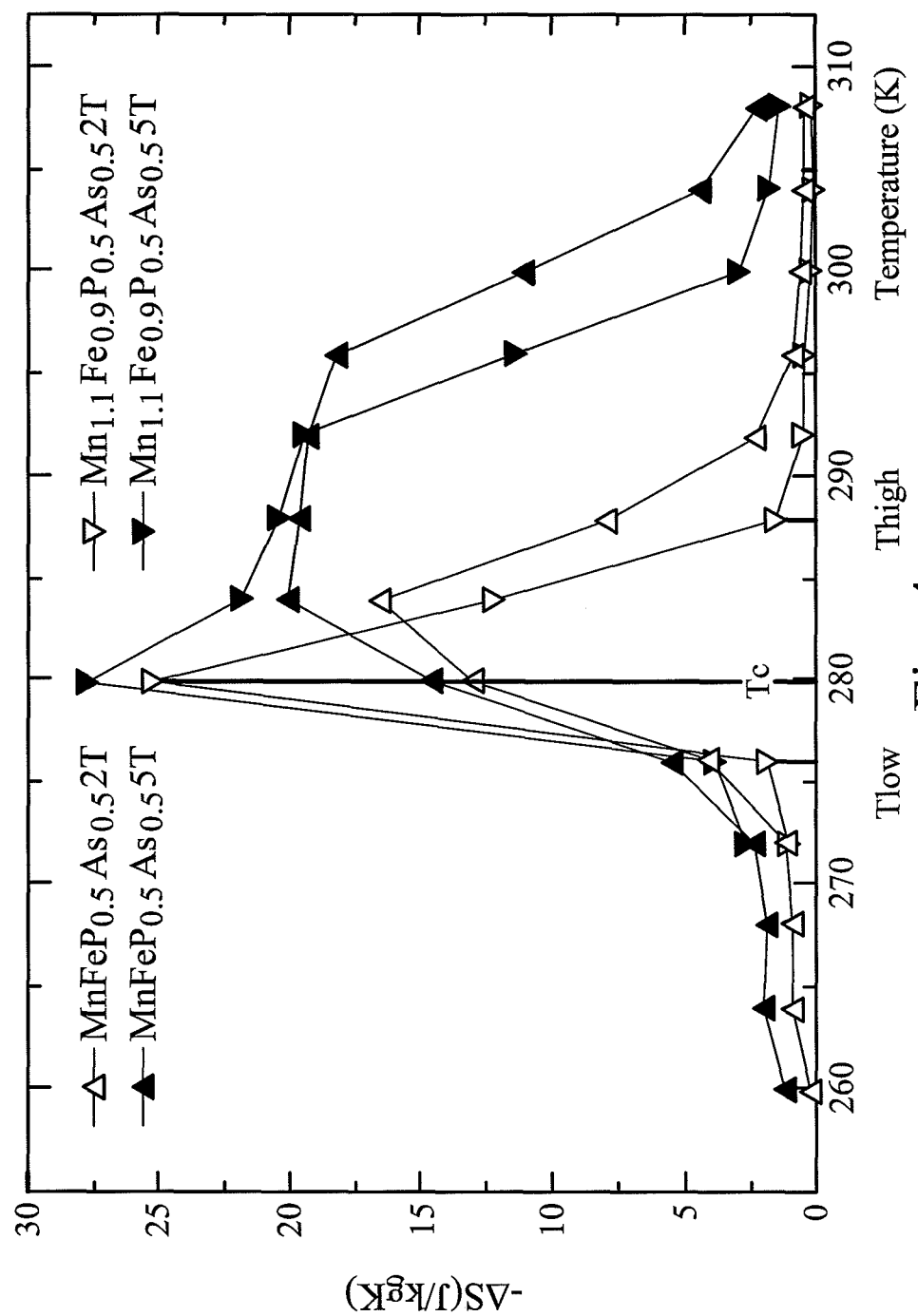
FIG. 4. shows MCE of MnFePAs in 2 T and 5 T magnetic field.

It should be noted that the temperature difference of the system for converting energy should be larger than the temperature difference for changing the magnetic phase of the MCEM. Generally, the temperature difference of day and night is sometimes larger than 40 Kelvin. Again referring to FIG. 4, the temperature difference of the MCEM, such as $MnFeP_{0.5}As_{0.5}$, for changing the magnetic phase thereof is about 12-15 Kevin only. If a hot source is arranged to absorb the heat from the hotter environment in the day time, and a cold source is arranged to expel the heat to the cooler environment in the night time, the temperature difference between the hot and cold sources will be as large as 40 Kevin, and the temperature difference is large enough for changing the magnetic field of the MCEM, i.e. $MnFeP_{0.5}As_{0.5}$. The heat-power conversion magnetism device to be driven by the temperature difference in the environment is workable.

To sum up, while the invention has been described by way of example and in terms of preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat-power conversion magnetism device comprising:
   a magnet having a pair of magnetic poles for providing magnetic potential energy and delivering of magnetic flux;
   a sleeve disposed around the magnet;
   a plurality of thermal magnetic flux gate units; and
   a hot source for heating up a first part of the thermal magnetic flux gate units;
   wherein magnetic flux paths are formed through the first part of the thermal magnetic flux gate units.

2. The device as claimed in claim 1, wherein the hot source is changed for heating a second part of the thermal magnetic flux gate units, and the first part and the second part of the thermal magnetic flux gate units are overlapped.

3. The device as claimed in claim 1, wherein the sleeve comprises a permeable magnetic material.

4. The device as claimed in claim 1, wherein the thermal magnetic flux gate units comprises a magneto caloric effect material.

5. The device as claimed in claim 4, wherein the hot source is at a temperature higher than a Curie Temperature of the magneto caloric effect material.

6. The device as claimed in claim 4, wherein the magneto caloric effect material comprises $MnFeP_{0.5}As_{0.5}$.

7. The device as claimed in claim 1 further comprising a cold source for cooling the thermal magnetic flux gate units.

8. The device as claimed in claim 1, wherein the thermal magnetic flux gate units are disposed between the magnet and the sleeve.

9. The device as claimed in claim 8, wherein the magnet is fixed and the sleeve is rotatable.

10. The device as claimed in claim 8, wherein the sleeve is fixed and the magnet is rotatable.

11. The device as claimed in claim 1, wherein the magnet is a Halbach magnet.

12. The device as claimed in claim 1, wherein the hot source is solar energy or heated water.

13. A thermal magnetic flux gate unit comprising:
   a container sealed with fluid and divided into a first section and a second section;
   a porous structure disposed in the first section; and
   a wick structure disposed at an inner face of the container, wherein the porous structure comprises a magneto caloric effect material.

14. The unit as claimed in claim 13, wherein the fluid is heated at the second section into a vapor.

15. The unit as claimed in claim 13, wherein the fluid located in the porous structure of the first section flows to the second section through the wick structure.

16. A regeneration thermal convection unit comprising:
   a container;
   a porous structure disposed in the container;
   a first chamber and a second chamber connected to the container, respectively; and fluid filled in the container so that the fluid flows within the first chamber and the second chamber through the container;

wherein the porous structure comprises a magneto caloric effect material.

17. A system for converting energy comprising:
a heat collector for heating refrigerant;
a hot source for storing the heated refrigerant from the heat collector;
a cooling tower for cooling down the refrigerant;
a cold source for storing the cooled refrigerant from the cooling tower;
a thermal energy switching unit for receiving the heated refrigerant or the cooled refrigerant and controlling an output of refrigerant; and
a heat-power conversion device comprising:
a magnet having a pair of magnetic poles for providing magnetic potential energy and delivering of magnetic flux;
a sleeve disposed around the magnet; and
a plurality of thermal magnetic flux gate units;
wherein some of the thermal magnetic flux gate units are heated or cooled by the output of refrigerant.

18. The system as claimed in claim 17, wherein the heat collector is a solar collector.

19. The system as claimed in claim 17, wherein the sleeve comprises a permeable magnetic material.

20. The system as claimed in claim 17, wherein the thermal magnetic flux gate units comprise a magneto caloric effect material.

21. The system as claimed in claim 20, wherein the output of refrigerant provides a temperature higher than a Curie Temperature of the magneto caloric effect material.

22. The system as claimed in claim 20, wherein the magneto caloric effect material comprises $MnFeP_{0.5}As_{0.5}$.

23. The system as claimed in claim 17, wherein the thermal magnetic flux gate units are disposed between the magnet and the sleeve.

24. A system for converting solar energy, comprising:
a collector for collecting solar energy;
a distributor connected to the collector and guiding the solar energy into a tunnel; and
a heat-power conversion magnetism device comprising:
a magnet having a pair of magnetic poles for providing magnetic potential energy and delivering of magnetic flux;
a sleeve disposed around the magnet; and
a plurality of thermal magnetic flux gate units;
wherein some of the thermal magnetic flux gate units are heated up by the solar energy transmitted from the tunnel.

* * * * *